United States Patent
Mokhlesi

(10) Patent No.: US 8,098,526 B2
(45) Date of Patent: *Jan. 17, 2012

(54) REVERSE READING IN NON-VOLATILE MEMORY WITH COMPENSATION FOR COUPLING

(75) Inventor: Nima Mokhlesi, Los Gatos, CA (US)

(73) Assignee: SanDisk Technologies Inc., Plano, TX (US)

( * ) Notice: Subject to any disclaimer, the term of this patent is extended or adjusted under 35 U.S.C. 154(b) by 32 days.

This patent is subject to a terminal disclaimer.

(21) Appl. No.: 12/710,984

(22) Filed: Feb. 23, 2010

(65) Prior Publication Data

US 2010/0149876 A1 Jun. 17, 2010

Related U.S. Application Data

(63) Continuation of application No. 11/537,548, filed on Sep. 29, 2006, now Pat. No. 7,684,247.

(51) Int. Cl.
*G11C 11/34* (2006.01)
*G11C 16/04* (2006.01)

(52) U.S. Cl. ......... 365/185.21; 365/185.02; 365/185.17; 365/185.18; 365/185.24

(58) Field of Classification Search ............ 365/185.17, 365/185.18, 185.21, 185.24
See application file for complete search history.

(56) References Cited

U.S. PATENT DOCUMENTS

| | | | |
|---|---|---|---|
| 5,101,378 A | 3/1992 | Radjy et al. | |
| 5,449,947 A | 9/1995 | Chen et al. | |
| 5,469,444 A | 11/1995 | Endoh et al. | |
| 5,532,962 A | 7/1996 | Auclair et al. | |
| 5,570,315 A | 10/1996 | Tanaka et al. | |
| 5,581,504 A | 12/1996 | Chang | |
| 5,764,572 A | 6/1998 | Hammick | |
| 5,774,397 A | 6/1998 | Endoh et al. | |

(Continued)

FOREIGN PATENT DOCUMENTS

EP 01271553 1/2003

(Continued)

OTHER PUBLICATIONS

Restriction dated Oct. 23, 2007, United States Patent & Trademark Office, U.S. Appl. No. 11/537,556, filed Sep. 29, 2006.

(Continued)

*Primary Examiner* — Ly D Pham
(74) *Attorney, Agent, or Firm* — Vierra Magen Marcus & DeNiro LLP

(57) ABSTRACT

Shifts in the apparent charge stored by a charge storage region such as a floating gate in a non-volatile memory cell can occur because of electrical field coupling based on charge stored in adjacent (or other) charge storage regions. Although not exclusively, the effects are most pronounced in situations where adjacent memory cells are programmed after a selected memory cell. To account for the shift in apparent charge, one or more compensations are applied when reading storage elements of a selected word line based on the charge stored by storage elements of other word lines. Efficient compensation techniques are provided by reverse reading blocks (or portions thereof) of memory cells. By reading in the opposite direction of programming, the information needed to apply (or select the results of) an appropriate compensation when reading a selected cell is determined during the actual read operation for the adjacent word line rather than dedicating a read operation to determine the information.

20 Claims, 21 Drawing Sheets

U.S. PATENT DOCUMENTS

| | | | |
|---|---|---|---|
| 5,781,478 A | 7/1998 | Takeuchi et al. |
| 5,812,457 A | 9/1998 | Arase |
| 5,814,853 A | 9/1998 | Chen |
| 5,867,429 A | 2/1999 | Chen et al. |
| 5,898,615 A | 4/1999 | Chida |
| 5,917,766 A | 6/1999 | Tsuji et al. |
| 5,943,257 A | 8/1999 | Jeon et al. |
| 6,046,935 A | 4/2000 | Takeuchi et al. |
| 6,061,280 A | 5/2000 | Aritome |
| 6,154,391 A | 11/2000 | Takeuchi et al. |
| 6,175,222 B1 | 1/2001 | Fang |
| 6,212,101 B1 | 4/2001 | Lee |
| 6,222,762 B1 | 4/2001 | Guterman et al. |
| 6,240,016 B1 | 5/2001 | Haddad et al. |
| 6,259,632 B1 | 7/2001 | Khouri et al. |
| 6,377,507 B1 | 4/2002 | Tsao |
| 6,380,033 B1 | 5/2002 | He et al. |
| 6,411,548 B1 | 6/2002 | Sakui et al. |
| 6,456,528 B1 | 9/2002 | Chen |
| 6,522,580 B2 | 2/2003 | Chen et al. |
| 6,535,423 B2 | 3/2003 | Trivedi et al. |
| 6,542,407 B1 | 4/2003 | Chen et al. |
| 6,570,785 B1 | 5/2003 | Mangan et al. |
| 6,570,790 B1 | 5/2003 | Harari |
| 6,594,181 B1 | 7/2003 | Yamada |
| 6,643,188 B2 | 11/2003 | Tanaka et al. |
| 6,657,891 B1 | 12/2003 | Shibata et al. |
| 6,707,714 B2 | 3/2004 | Kawamura |
| 6,717,847 B2 | 4/2004 | Chen |
| 6,771,536 B2 | 8/2004 | Li et al. |
| 6,781,877 B2 | 8/2004 | Cernea et al. |
| 6,785,169 B1 | 8/2004 | Nemati et al. |
| 6,798,698 B2 | 9/2004 | Tanaka et al. |
| 6,807,095 B2 | 10/2004 | Chen et al. |
| 6,870,766 B2 | 2/2005 | Cho et al. |
| 6,870,768 B2 | 3/2005 | Cernea et al. |
| 6,888,758 B1 | 5/2005 | Hemink et al. |
| 6,891,262 B2 | 5/2005 | Nomoto et al. |
| 6,956,770 B2 | 10/2005 | Khalid et al. |
| 7,006,379 B2 | 2/2006 | Noguchi et al. |
| 7,012,835 B2 | 3/2006 | Gonzalez et al. |
| 7,020,017 B2 | 3/2006 | Chen et al. |
| 7,031,214 B2 | 4/2006 | Tran |
| 7,057,936 B2 | 6/2006 | Yaegashi et al. |
| 7,085,167 B2 | 8/2006 | Lee et al. |
| 7,099,194 B2 | 8/2006 | Tu et al. |
| 7,177,977 B2 | 2/2007 | Chen et al. |
| 7,233,522 B2 | 6/2007 | Chen et al. |
| 7,304,894 B2 | 12/2007 | Joo |
| 7,447,076 B2 | 11/2008 | Mokhlesi |
| 7,684,247 B2 * | 3/2010 | Mokhlesi ................ 365/185.18 |
| 2003/0025147 A1 | 2/2003 | Nomoto et al. |
| 2003/0053334 A1 | 3/2003 | Chen |
| 2003/0137888 A1 | 7/2003 | Chen et al. |
| 2003/0161182 A1 | 8/2003 | Li et al. |
| 2004/0019737 A1 | 1/2004 | Kastoriano et al. |
| 2004/0047182 A1 | 3/2004 | Cernea et al. |
| 2004/0057283 A1 | 3/2004 | Cernea |
| 2004/0057285 A1 | 3/2004 | Cernea et al. |
| 2004/0057287 A1 | 3/2004 | Cernea et al. |
| 2004/0057318 A1 | 3/2004 | Cernea et al. |
| 2004/0060031 A1 | 3/2004 | Cernea |
| 2004/0109357 A1 | 6/2004 | Cernea et al. |
| 2004/0213031 A1 | 10/2004 | Koji |
| 2005/0073978 A1 | 4/2005 | Kim et al. |
| 2005/0162913 A1 | 7/2005 | Chen |
| 2006/0221683 A1 | 10/2006 | Chen et al. |
| 2006/0221692 A1 | 10/2006 | Chen |
| 2006/0221714 A1 | 10/2006 | Li et al. |

FOREIGN PATENT DOCUMENTS

| | | |
|---|---|---|
| EP | 01329898 | 1/2003 |
| EP | 1172822 | 3/2007 |
| WO | WO2006/107731 A | 10/2006 |

OTHER PUBLICATIONS

Non-Final Office Action dated Feb. 11, 2008, United States Patent & Trademark Office, U.S. Appl. No. 11/537,556, filed Sep. 29, 2006.

Response to Non-Final Office Action dated May 12, 2008, U.S. Appl. No. 11/537,556, filed Sep. 29, 2006.

Notice of Allowance and Fee(s) Due dated Jul. 2, 2008, United States Patent & Trademark Office, U.S. Appl. No. 11/537,556, filed Sep. 29, 2006.

International Search Report & The Written Opinion dated Mar. 17, 2008, Patent Cooperation Treaty, International Application No. PCT/US2007/078950, filed Sep. 19, 2007.

International Preliminary Report dated Apr. 9, 2009, Patent Cooperation Treaty, International Application No. PCT/US2007/078950, filed Sep. 19, 2007.

Restriction dated Feb. 18, 2009, United States Patent & Trademark Office, U.S. Appl. No. 11/537,548, filed Sep. 29, 2006.

Response to Restriction dated Mar. 18, 2009, U.S. Appl. No. 11/537,548, filed Sep. 29, 2006.

Non-Final Office Action dated May 12, 2009, United States Patent & Trademark Office, U.S. Appl. No. 11/537,548, filed Sep. 29, 2006.

Response to Non-Final Office Action dated Aug. 12, 2009, U.S Appl. No. 11/537,548, filed Sep. 29, 2006.

Notice of Allowance and Fee(s) Due dated Oct. 20, 2009, United States Patent & Trademark Office, U.S. Appl. No. 11/537,548, filed Sep. 29, 2006.

* cited by examiner

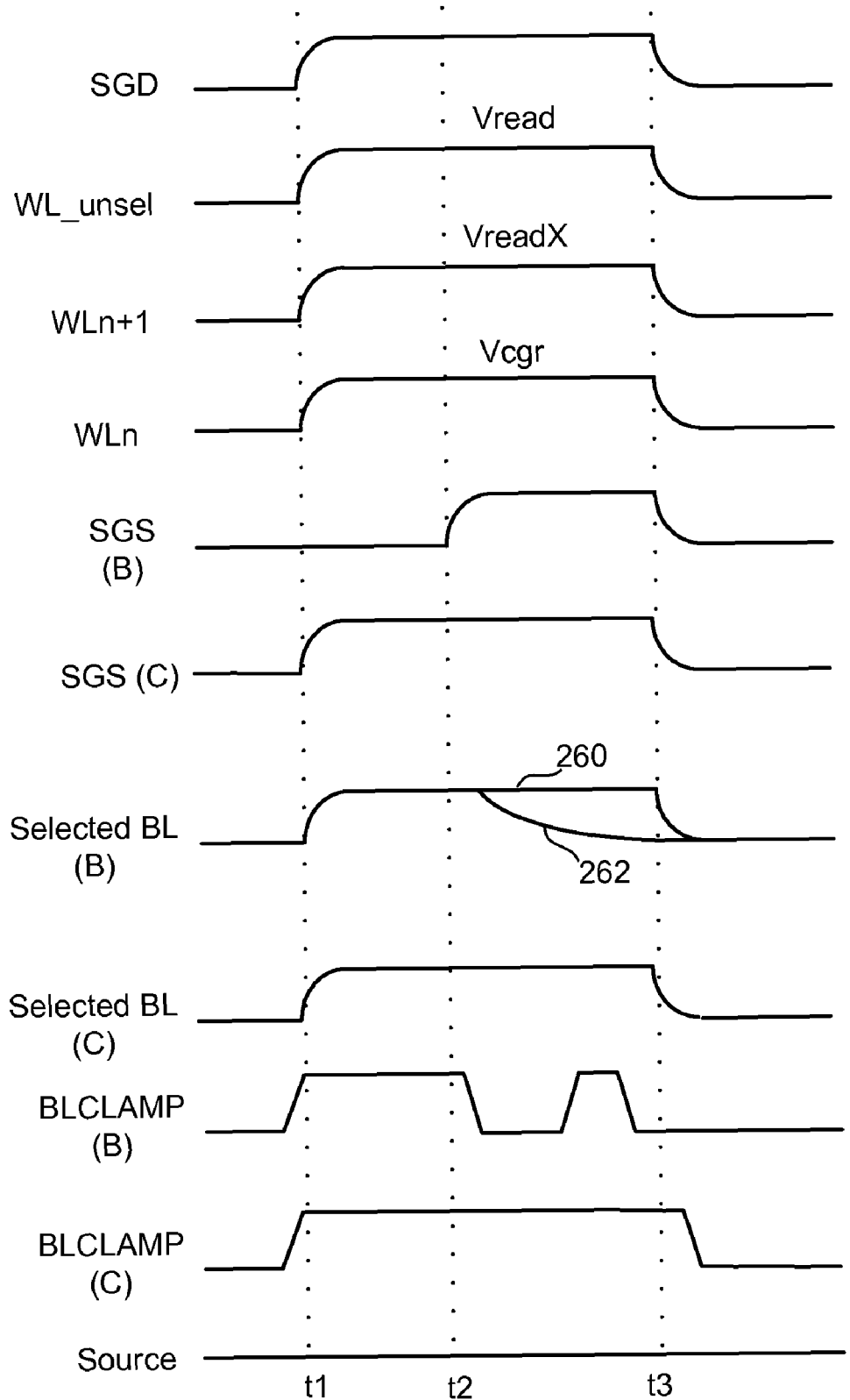

| 550 | program sequence 552 | read sequence 554, 556 | # sense operations 558 |
|---|---|---|---|
| WL15 | 16 | 16 | 1) WL15 | 3 (1 SR) |
|  |  |  | - - | - - |
| WL14 | 15 | 15 | 2) WL14 | 12 (4 SRs) |
|  |  |  | 1) WL15 | 3 (1 SR) |
| WL13 | 14 | 14 | 2) WL13 | 12 (4 SRs) |
|  |  |  | 1) WL14 | 3 (1 SR) |
| WL12 | 13 | 13 | 2) WL12 | 12 (4 SRs) |
|  |  |  | 1) WL13 | 3 (1 SR) |
| WL11 | 12 | 12 | 2) WL11 | 12 (4 SRs) |
|  |  |  | 1) WL12 | 3 (1 SR) |
| WL10 | 11 | 11 | 2) WL10 | 12 (4 SRs) |
|  |  |  | 1) WL11 | 3 (1 SR) |
| WL9 | 10 | 10 | 2) WL9 | 12 (4 SRs) |
|  |  |  | 1) WL10 | 3 (1 SR) |
| WL8 | 9 | 9 | 2) WL8 | 12 (4 SRs) |
|  |  |  | 1) WL9 | 3 (1 SR) |
| WL7 | 8 | 8 | 2) WL7 | 12 (4 SRs) |
|  |  |  | 1) WL8 | 3 (1 SR) |
| WL6 | 7 | 7 | 2) WL6 | 12 (4 SRs) |
|  |  |  | 1) WL7 | 3 (1 SR) |
| WL5 | 6 | 6 | 2) WL5 | 12 (4 SRs) |
|  |  |  | 1) WL6 | 3 (1 SR) |
| WL4 | 5 | 5 | 2) WL4 | 12 (4 SRs) |
|  |  |  | 1) WL5 | 3 (1 SR) |
| WL3 | 4 | 4 | 2) WL3 | 12 (4 SRs) |
|  |  |  | 1) WL4 | 3 (1 SR) |
| WL2 | 3 | 3 | 2) WL2 | 12 (4 SRs) |
|  |  |  | 1) WL3 | 3 (1 SR) |
| WL1 | 2 | 2 | 2) WL1 | 12 (4 SRs) |
|  |  |  | 1) WL2 | 3 (1 SR) |
| WL0 | 1 | 1 | 2) WL0 | 12 (4 SRs) |
|  |  |  | 1) WL1 | 3 (1 SR) |

| total sense operations | 228 (93) | 560 |

Fig. 18

| 570 | program sequence 572 | read sequence 574 | 576 | # sense operations 578 |
|---|---|---|---|---|
| WL15 | 16 | 1 | WL15 | 3 (1 SR) |
| WL14 | 15 | 2 | WL14 | 12 (4 SRs) |
| WL13 | 14 | 3 | WL13 | 12 (4 SRs) |
| WL12 | 13 | 4 | WL12 | 12 (4 SRs) |
| WL11 | 12 | 5 | WL11 | 12 (4 SRs) |
| WL10 | 11 | 6 | WL10 | 12 (4 SRs) |
| WL9 | 10 | 7 | WL9 | 12 (4 SRs) |
| WL8 | 9 | 8 | WL8 | 12 (4 SRs) |
| WL7 | 8 | 9 | WL7 | 12 (4 SRs) |
| WL6 | 7 | 10 | WL6 | 12 (4 SRs) |
| WL5 | 6 | 11 | WL5 | 12 (4 SRs) |
| WL4 | 5 | 12 | WL4 | 12 (4 SRs) |
| WL3 | 4 | 13 | WL3 | 12 (4 SRs) |
| WL2 | 3 | 14 | WL2 | 12 (4 SRs) |
| WL1 | 2 | 15 | WL1 | 12 (4 SRs) |
| WL0 | 1 | 16 | WL0 | 12 (4 SRs) |

| total sense operations | 183 (48) | 580 |
|---|---|---|

Fig. 19

| physical block | program sequence | read sequence | | # sense operations |
|---|---|---|---|---|
| WL15 | 16 | 13 | WL15 | 3 (1 SR) |
| WL14 | 15 | 14 | WL14 | 12 (4 SRs) |
| WL13 | 14 | 15 | WL13 | 12 (4 SRs) |
| WL12 | 13 | 16 | WL12 | 12 (4 SRs) |
| WL11 | 12 | 9 | 1) WL12 | 3 (1 SR) |
| | | | 2) WL11 | 12 (4 SRs) |
| WL10 | 11 | 10 | WL10 | 12 (4 SRs) |
| WL9 | 10 | 11 | WL9 | 12 (4 SRs) |
| WL8 | 9 | 12 | WL8 | 12 (4 SRs) |
| WL7 | 8 | 5 | 1) WL8 | 3 (1 SR) |
| | | | 2) WL7 | 12 (4 SRs) |
| WL6 | 7 | 6 | WL6 | 12 (4 SRs) |
| WL5 | 6 | 7 | WL5 | 12 (4 SRs) |
| WL4 | 5 | 8 | WL4 | 12 (4 SRs) |
| WL3 | 4 | 1 | 1) WL4 | 3 (1 SR) |
| | | | 2) WL3 | 12 (4 SRs) |
| WL2 | 3 | 2 | WL2 | 12 (4 SRs) |
| WL1 | 2 | 3 | WL1 | 12 (4 SRs) |
| WL0 | 1 | 4 | WL0 | 12 (4 SRs) |
| | | | total # of sense operations | 192 |

Fig. 22

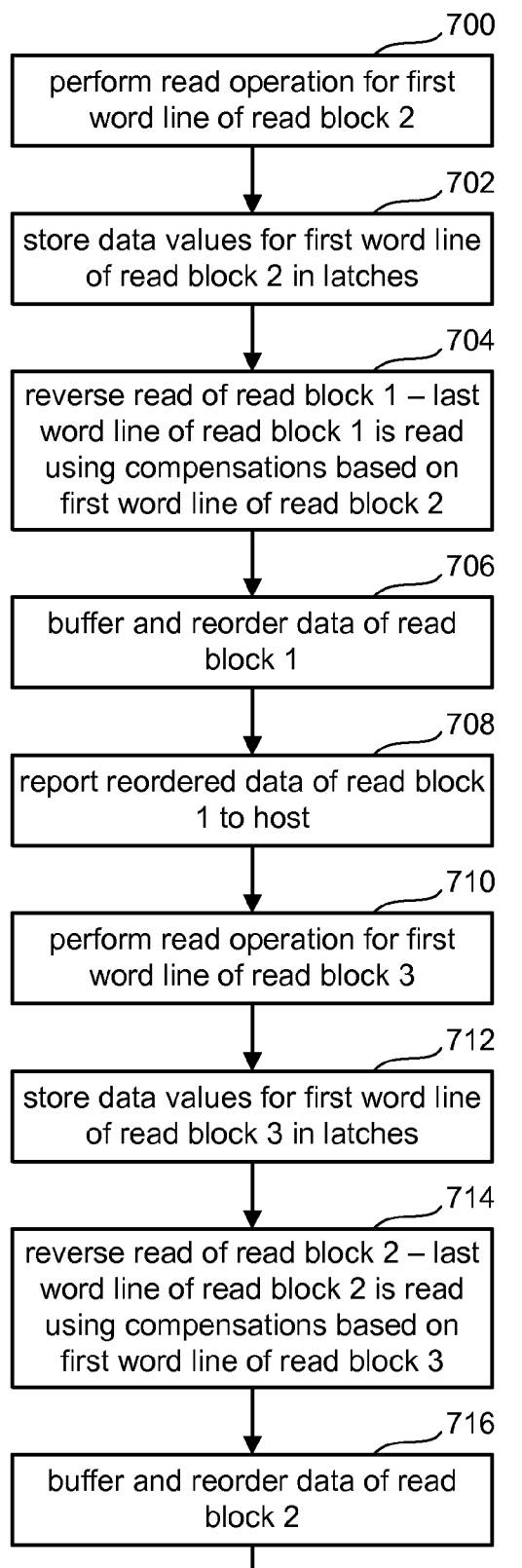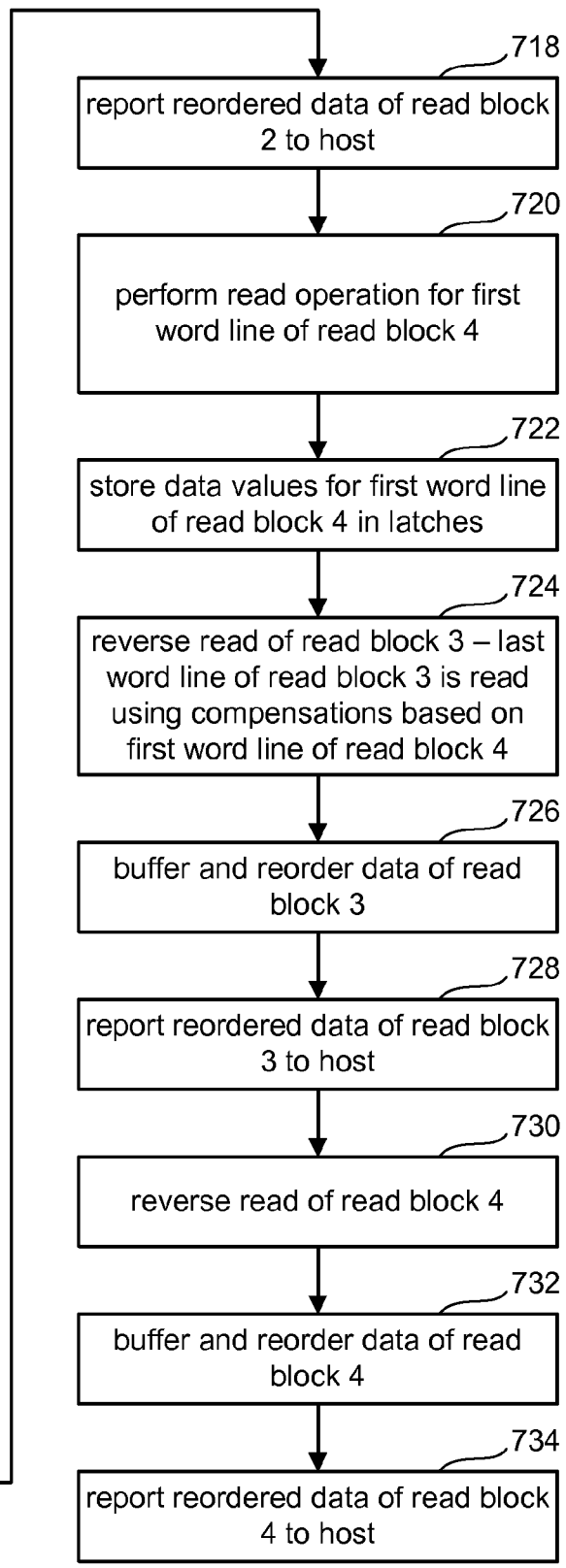
Fig. 23

REVERSE READING IN NON-VOLATILE MEMORY WITH COMPENSATION FOR COUPLING

CLAIM OF PRIORITY

This application is a continuation application of U.S. patent application Ser. No. 11/537,548, entitled "REVERSE READING IN NON-VOLATILE MEMORY WITH COMPENSATION FOR COUPLING," filed Sep. 29, 2006, now U.S. Pat. No. 7,684,247, and incorporated herein by reference in its entirety.

CROSS-REFERENCE TO RELATED APPLICATIONS

The following application is cross-referenced and incorporated by reference herein in its entirety:

U.S. patent application Ser. No. 11/537,556, entitled "Systems for Reverse Reading in Non-Volatile Memory with Compensation for Coupling," now U.S. Pat. No. 7,447,076, by Nima Mokhlesi, filed Sep. 29, 2006.

BACKGROUND OF THE INVENTION

1. Field of the Invention

Embodiments of the present disclosure are directed to non-volatile memory technology.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM), including flash EEPROM, and Electronically Programmable Read Only Memory (EPROM) are among the most popular non-volatile semiconductor memories.

One example of a flash memory system uses the NAND structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 10, 12, 14 and 16 in series between a first select gate 12 and a second select gate 22. Select gate 12 connects the NAND string to bit line terminal 26. Select gate 22 connects the NAND string to source line terminal 28. Select gate 12 is controlled by applying appropriate voltages to control gate 20CG via selection line SGD. Select gate 22 is controlled by applying the appropriate voltages to control gate 22CG via selection line SGS. Each of the transistors 10, 12, 14 and 16 includes a control gate and a floating gate, forming the gate elements of a memory cell. For example, transistor 10 includes control gate 10CG and floating gate 10FG. Transistor 12 includes control gate 12CG and a floating gate 12FG. Transistor 14 includes control gate 14CG and floating gate 14FG. Transistor 16 includes a control gate 16CG and a floating gate 16FG. Control gate 10CG is connected to word line WL3, control gate 12CG is connected to word line WL2, control gate 14CG is connected to word line WL1, and control gate 16CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string. A typical architecture for a flash memory system using a NAND structure will include several NAND strings. Relevant examples of NAND-type flash memories and their operation are provided in the following U.S. patents/patent applications, all of which are incorporated herein by reference in their entirety: U.S. Pat. Nos. 5,570,315; 5,774,397; 6,046,935; 5,386,422; 6,456,528; and U.S. patent application Ser. No. 09/893,277 (Publication No. US2003/0002348). Other types of non-volatile memory in addition to NAND flash memory can also be used in accordance with embodiments.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. The floating gate charge and threshold voltage of the cell can be indicative of a particular state corresponding to stored data. More information about programming can be found in U.S. patent application Ser. No. 10/379,608, titled "Self Boosting Technique," filed on Mar. 5, 2003; and in U.S. patent application Ser. No. 10/629,068, titled "Detecting Over Programmed Memory," filed on Jul. 29, 2003, both applications are incorporated herein by reference in their entirety.

Shifts in the apparent charge stored on a floating gate can occur because of coupling of an electric field based on the charge stored in neighboring floating gates. This floating gate to floating gate coupling phenomena is described in U.S. Pat. No. 5,867,429, which is incorporated herein by reference in its entirety. The floating gate to floating gate coupling phenomena occurs most pronouncedly, although not exclusively, between sets of adjacent memory cells that have been programmed at different times. For example, a first memory cell can be programmed to add a level of charge to its floating gate that corresponds to a set of data. Subsequently, one or more adjacent memory cells are programmed to add a level of charge to their floating gates that correspond to a set of data. After one or more of the adjacent memory cells are programmed, the charge level read from the first memory cell may appear to be different than when it was programmed because of the effect of the charge on the adjacent memory cell(s) being coupled to the first memory cell. The coupling from adjacent memory cells can shift the apparent charge level being read from a selected memory cell by a sufficient amount to lead to an erroneous reading of the stored data.

As memory cells continue to shrink in size, the natural programmed and erase distributions of threshold voltages are expected to increase due to short channel effects, greater oxide thickness/coupling ratio variations and more channel dopant fluctuations, reducing the available separation between adjacent states. This effect is much more significant for multi-state memories than binary memories using only two states. The reduction of the space between word lines and between bit lines will also increase the coupling between adjacent floating gates. The effect of the floating gate to floating gate coupling is of greater concern for multi-state devices because the allowed threshold voltage ranges and the forbidden ranges (range between two distinct threshold voltage ranges that represent distinct memory states) are narrower than in binary devices. Therefore, floating gate to floating gate coupling can result in memory cells being shifted from an allowed threshold voltage range to a forbidden range.

SUMMARY OF THE INVENTION

Shifts in the apparent charge stored by a charge storage region such as a floating gate in a non-volatile memory cell can occur because of electrical field coupling based on charge stored in adjacent (or other) charge storage regions. Although not exclusively, the effects are most pronounced in situations where adjacent memory cells are programmed after a selected memory cell. To account for the shift in apparent charge, one or more compensations are applied when reading storage elements of a selected word line based on the charge stored by storage elements of other word lines. Efficient compensation techniques are provided by reverse reading blocks (or portions thereof) of memory cells. By reading in the opposite direction of programming, the information needed to apply (or select the results of) an appropriate compensation when reading a selected cell is determined during the actual read operation for the adjacent word line rather than dedicating a read operation to determine the information.

One embodiment includes programming non-volatile storage elements coupled to a plurality of word lines beginning with a first word line adjacent a first set of select gates and ending with a last word line adjacent a second set of select gates. Programming includes changing a threshold voltage of selected ones of the storage elements in accordance with a target memory state. Reading the non-volatile storage elements coupled to the plurality of word lines begins with the last word line and end with the first word line. Reading the storage elements includes, for each word line except the last word line, applying one or more compensations based on reading a word line adjacent to each word line in a direction of the second set of select gates.

Another embodiment includes receiving a request for data stored in a set of non-volatile storage elements coupled to a plurality of word lines. The data is programmed to the set of non-volatile storage elements beginning with storage elements coupled to a first word line and ending with storage elements coupled to a last word line. The first word line is adjacent to a second word line of the plurality. In response to the request, the set of non-volatile storage elements is read in a sequence beginning with storage elements coupled to the last word line and ending with storage elements coupled to the first word line, wherein reading storage elements coupled to the first word line includes applying one or more compensations based on charge stored in storage elements of the second word line. Reading further includes buffering data from storage elements of the second word line prior to reading the storage elements of said first word line, buffering data from storage elements of the first word line after buffering data from storage elements of the second word line, and maintaining the buffered data from storage elements of the second word line after buffering data from storage elements of the first word line.

BRIEF DESCRIPTION OF THE DRAWINGS

FIG. 9 is a timing diagram that explains the behavior of certain signals during read/verify operations.

FIG. 18 is a table illustrating reading of a set of memory cells using compensation according to the prior art.

FIG. 19 is a table illustrating reading of a set of memory cells using compensation according to one embodiment.

FIG. 22 is a table illustrating reading of a set of memory cells with compensation using read blocks in accordance with one embodiment.

FIG. 23 is a flowchart for reading a set of memory cells using read blocks in accordance with one embodiment.

DETAILED DESCRIPTION

Figure 1:
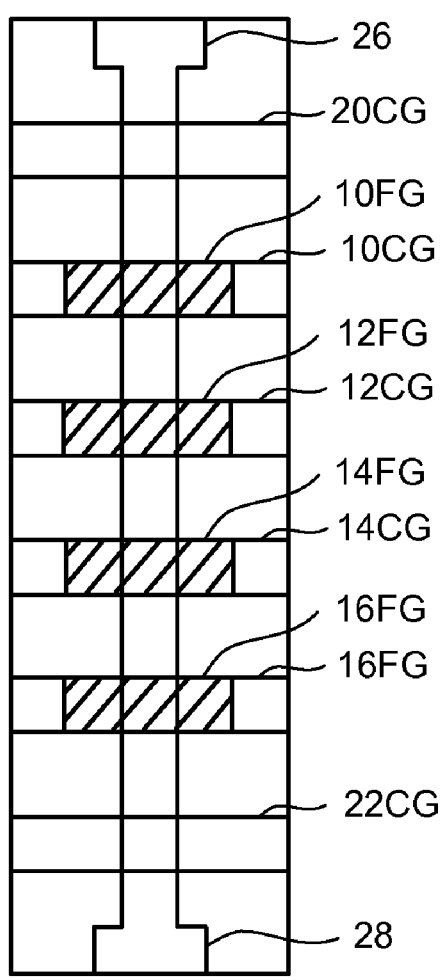
FIG. 1 is a top view of a NAND string.

Memory cells can be used to store data represented in analog or digital form through manipulation of the cell's threshold voltage. The range of possible threshold voltages of a memory cell can be divided into ranges which represent distinct memory states. For example, two ranges of threshold voltages can be used to establish two memory states that are assigned logical data 1 and 0. At least one reference threshold voltage level is generally established so as to partition the threshold voltage memory window of the memory cell into the two ranges. When the cell is read by applying predetermined, fixed voltages (e.g., read reference voltages) to its gate that correspond to the reference threshold voltage level, its source/drain conduction state is established by comparing the conduction with a breakpoint level or reference current. If the current read is higher than that of the reference current level, the cell is determined to be "on" and in one logical state. If the current is less than the reference current level, the cell is determined to be "off" and in the other logical state. In one example of a NAND-type flash memory, the voltage threshold is negative after the memory cell is erased, and defined as logic 1. The threshold voltage is positive after a program operation, and defined as logic 0. When the threshold voltage is negative and a read is attempted by applying 0V to the control gate, the memory cell will turn on to indicate logic 1 is being stored. When the threshold voltage is positive and a read operation is attempted by applying 0V to the control gate, the memory cell will not turn on to indicate that logic 0 is being stored.

A memory cell can also store multiple bits of digital data by utilizing more than two ranges of threshold voltages to represent distinct memory states. The threshold voltage window can be divided into the number of desired memory states and multiple voltage breakpoint levels used to resolve the individual states. For example, if four states are used, there will be four threshold voltage ranges representing four distinct memory states which are assigned the data values 11, 10, 01, and 00. The specific relationship between the data programmed into the memory cell and the threshold voltage ranges of the cell depends upon the data encoding scheme adopted for the memory cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells.

There are many ways to measure the conduction current of a memory cell during a read or verify operation. In one example, the conduction current of a memory cell is measured by the rate it discharges a dedicated capacitor in the sense amplifier. In another example, the conduction current of the selected memory cell allows (or fails to allow) the NAND string that included the memory cell to discharge the bit line. The charge on the bit line is measured after a period of time to see whether it has been discharged or not.

Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. The memory cells described in this paragraph can also be used. Thus, the technology described herein also applies to coupling between dielectric regions of different memory cells.

Another approach to storing two bits in each cell has been described by Eitan et al., "NROM: A Novel Localized Trapping, 2-Bit Non-volatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. The memory cells described in this paragraph can also be used.

Figure 2:
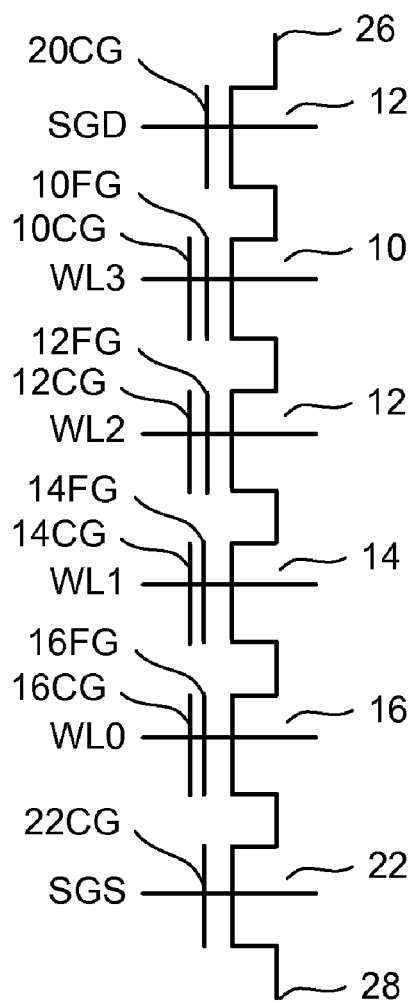
FIG. 2 is an equivalent circuit diagram of the NAND string of FIG. 1.
Figure 3:
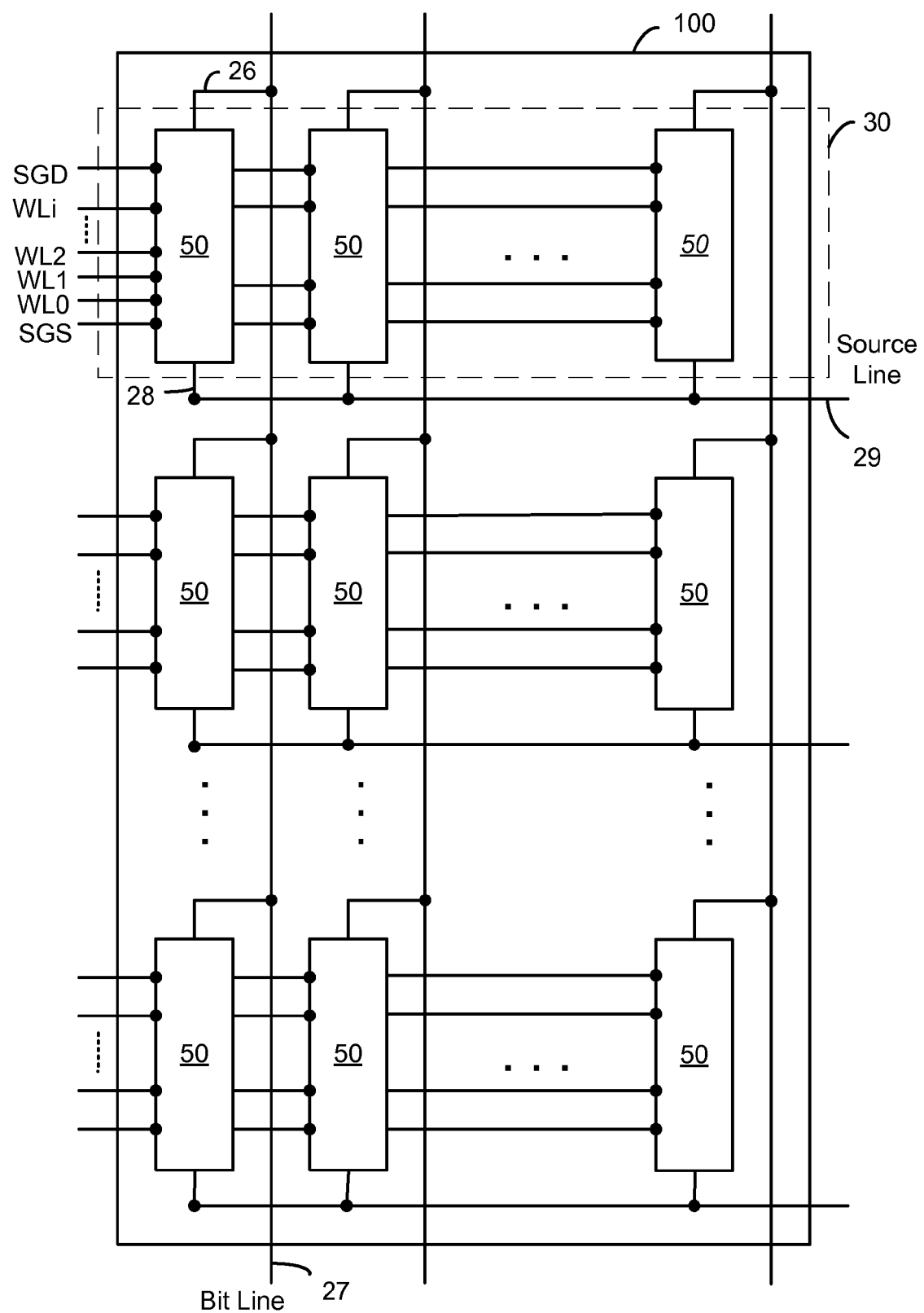
FIG. 3 is a block diagram of an array of NAND flash memory cells.

FIG. 3 illustrates an exemplary array 100 of NAND strings 50, such as those shown in FIGS. 1-2. Along each column, a bit line 27 is coupled to a drain terminal 26 of the bit line select gate for the NAND string 50. Along each row of NAND strings, a source line 29 may connect all the source terminals 28 of the source line select gates of the NAND strings.

The array 100 of memory cells is divided into a large number of blocks of memory cells. As is common for flash EEPROM systems, the block is the unit of erase and may be referred to as an erase block or physical block. Each block can contain the minimum number of memory cells that are erased together. In FIG. 3, a block such as block 30 includes all the cells connected to a common set of word lines WL0-WLi. Each block is typically divided into a number of pages. A page is typically a minimum unit of programming or reading, although more than one page may be programmed or read in a single operation. In another embodiment, the individual pages may be divided into segments and the segments may contain the fewest number of cells that are written at one time as a basic programming operation. One or more pages of data are typically stored in one row of memory cells. A page can store one or more sectors of data, the size of which is generally defined by a host system. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than those of the user data to which they pertain.

A sector of user data is typically 512 bytes, corresponding to the size of a sector commonly used in magnetic disk drives. Overhead data is typically an additional 16-20 bytes. A large number of pages form a block, anywhere from 8 pages, for example, up to 32, 64 or more pages. In some embodiments, a row of NAND strings comprises a block.

Memory cells are erased in one embodiment by raising the p-well to an erase voltage (e.g., 20 volts) for a sufficient period of time and grounding the word lines of a selected block while the source and bit lines are floating. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell is lowered. Those cells whose erase is to be inhibited have their word lines set to a floating condition. Due to capacitive coupling, the unselected word lines, bit lines, select lines, and common source lines are also raised to a significant fraction of the erase voltage, thus inhibiting erasing of the unselected cells. Erasing can be performed on the entire memory array, separate blocks, or another unit of cells.

Each block of memory cells includes a set of bit lines forming columns and a set of word lines forming rows. In one embodiment, the bit lines are divided into odd bit lines and even bit lines. Memory cells along a common word line and connected to the odd bit lines are programmed at one time, while memory cells along a common word line and connected to even bit lines are programmed at another time ("odd/even programming"). In another embodiment, memory cells are programmed along a word line for all bit lines in the block ("all bit line programming"). In other embodiments, the bit lines or block can be broken up into other groupings (e.g., left and right, more than two groupings, etc.).

Figure 4:
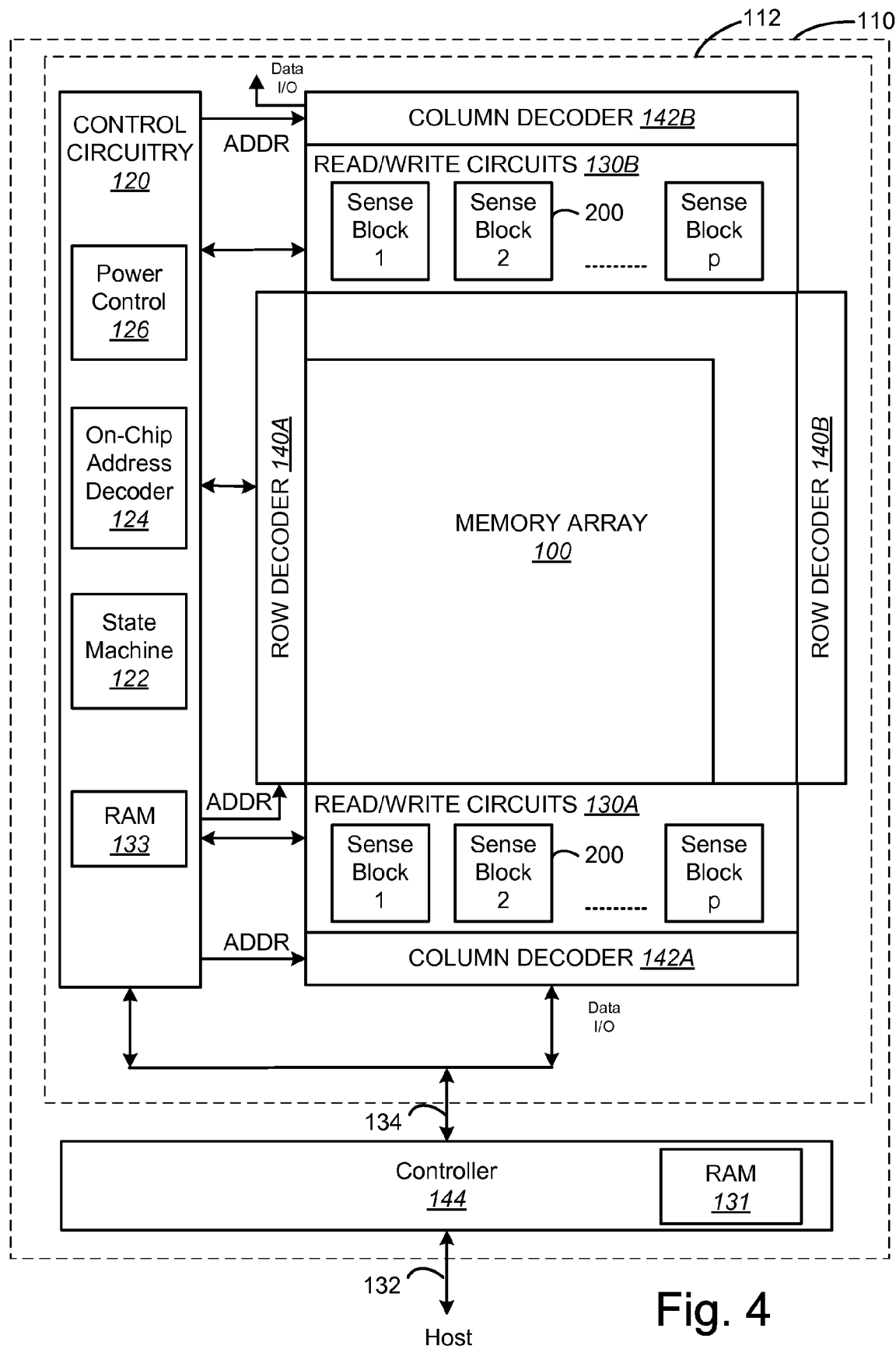
FIG. 4 is a block diagram of a non-volatile memory system.

FIG. 4 illustrates a memory device 110 having read/write circuits for reading and programming a page of memory cells in parallel. Memory device 110 may include one or more memory die or chips 112. Memory die 112 includes a two-dimensional array of memory cells 100, control circuitry 120, and read/write circuits 130A and 130B. In one embodiment, access to the memory array 100 by the various peripheral circuits is implemented in a symmetric fashion, on opposite sides of the array, so that the densities of access lines and circuitry on each side are reduced by half. The read/write circuits 130A and 130B include multiple sense blocks 200 which allow a page of memory cells to be read or programmed in parallel. The memory array 100 is addressable by word lines via row decoders 140A and 140B and by bit lines via column decoders 142A and 142B. In a typical embodiment a controller 144 is included in the same memory device 110 (e.g., a removable storage card or package) as the one or more memory die 112. Commands and data are transferred between the host and controller 144 via lines 132 and between the controller and the one or more memory die 112 via lines 134. The controller can include an optional RAM memory 131 in one embodiment to assist in data transfer.

The control circuitry 120 cooperates with the read/write circuits 130A and 130B to perform memory operations on the memory array 100. The control circuitry 120 includes a state machine 122, an on-chip address decoder 124 and a power control module 126. The state machine 122 provides chip-level control of memory operations. The on-chip address decoder 124 provides an address interface between that used by the host or a memory controller to the hardware address used by the decoders 140A, 140B, 142A, and 142B. The power control module 126 controls the power and voltages supplied to the word lines and bit lines during memory operations. An optional RAM memory 133 is provided in one embodiment to assist in memory operations.

Figure 5:
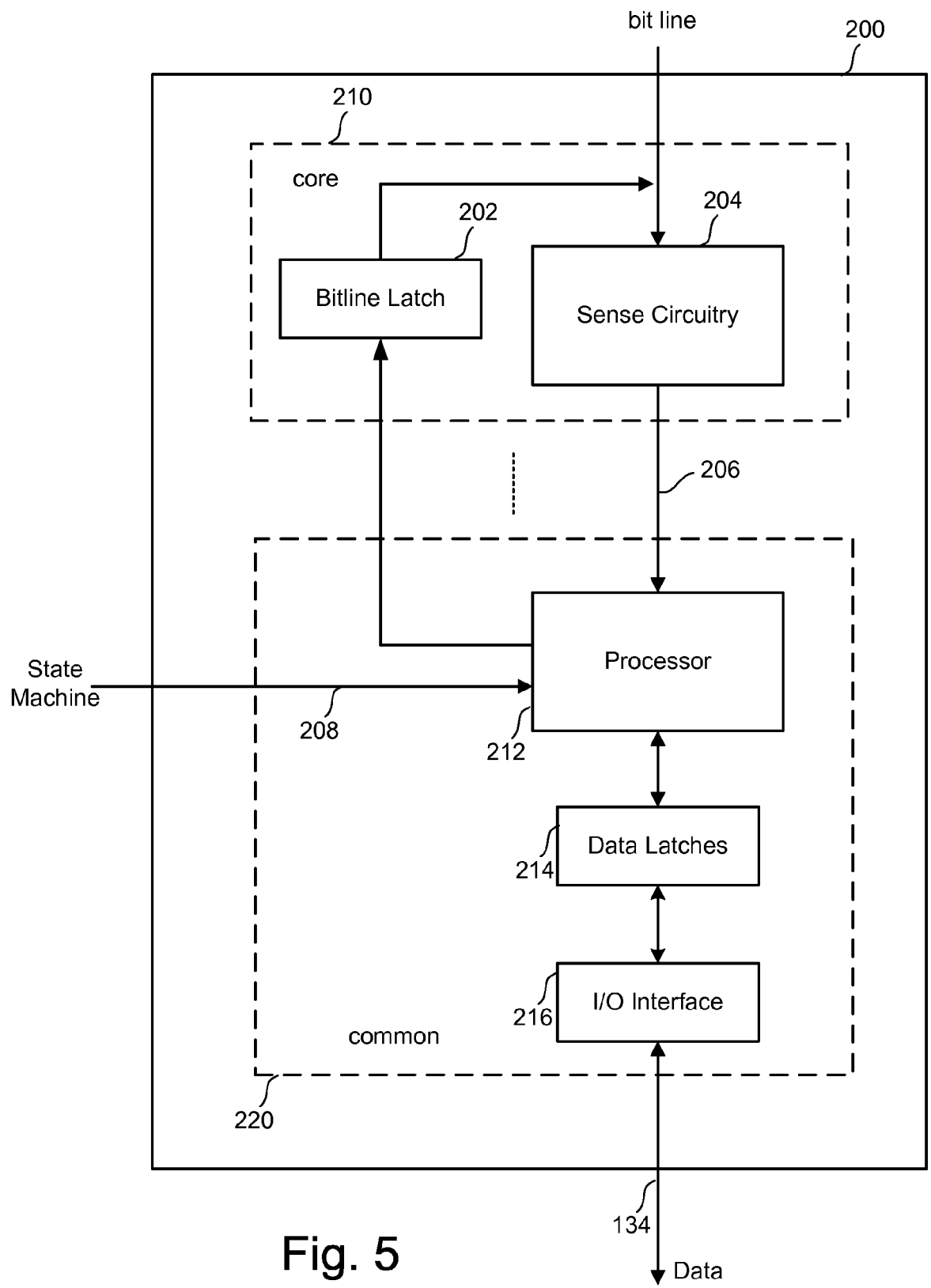
FIG. 5 is a block diagram of one embodiment of a sense block.

FIG. 5 is a block diagram of an individual sense block 200 partitioned into a core portion, referred to as a sense module 210, and a common portion 220. In one embodiment, there will be a separate sense module 210 for each bit line and one common portion 220 for a set of multiple sense modules 210. In one example, a sense block will include one common portion 220 and eight sense modules 210. Each of the sense modules in a group will communicate with the associated common portion via a data bus 206. For further details refer to U.S. patent application Ser. No. 11/026,536 "Non-Volatile Memory & Method with Shared Processing for an Aggregate of Sense Amplifiers" filed on Dec. 29, 2004 which is incorporated by reference herein in its entirety.

Sense module 210 comprises sense circuitry 204 that determines whether a conduction current in a connected bit line is above or below a predetermined threshold level. Sense module 210 also includes a bit line latch 202 that is used to set a voltage condition on the connected bit line. For example, a predetermined state latched in bit line latch 202 will result in the connected bit line being pulled to a state designating program inhibit (e.g., Vdd).

Common portion 220 includes a processor 212, a set of data latches 214 and an I/O Interface 216 coupled between the set of data latches 214 and data bus 134. Processor 212 performs computations. For example, one of its functions is to determine the data stored in the sensed memory cell and store the determined data in the set of data latches. The set of data latches 214 is used to store data bits determined by processor 212 during a read operation. It is also used to store data bits imported from the data bus 134 during a program operation. The imported data bits represent write data meant to be programmed into the memory. I/O interface 216 provides an interface between data latches 214 and the data bus 134.

During read or sensing, the operation of the system is under the control of state machine 122 of FIG. 4 that controls the supply of different control gate voltages to the addressed cell via word lines. As it steps through the various predefined control gate voltages corresponding to the various memory states supported by the memory, the sense module 210 will trip at one of these voltages and an output will be provided from sense module 210 to processor 212 via bus 206. At that point, processor 212 determines the resultant memory state by consideration of the tripping event(s) of the sense module and the information about the applied control gate voltage from the state machine via input lines 208. It then computes a binary encoding for the memory state and stores the resultant data bits into data latches 214. In another embodiment of the core portion, bit line latch 202 serves double duty, both as a latch for latching the output of the sense module 210 and also as a bit line latch as described above.

During program or verify, the data to be programmed is stored in the set of data latches 214 from the data bus 134. The program operation, under the control of the state machine, comprises a series of programming voltage pulses applied to the control gates of the addressed memory cells. Each programming pulse is followed by a read back (verify) to determine if the cell has been programmed to the desired memory state target threshold voltage. Processor 212 monitors the read back memory state relative to the desired memory state. When the two are in agreement, the processor 212 sets the bit line latch 202 so as to cause the bit line to be pulled to a condition designating program inhibit (e.g., Vdd). This inhibits the cell coupled to the bit line from further programming even if programming pulses appear on its control gate. In other embodiments the processor initially loads the bit line latch 202 and the sense circuitry sets it to an inhibit value during the verify process.

Data latch stack 214 contains a stack of data latches corresponding to the sense module. In one embodiment, there are three data latches per sense module 210. In some implementations (but not required), the data latches are implemented as a shift register so that the parallel data stored therein is converted to serial data for data bus 134, and vice versa. In the preferred embodiment, all the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

In general, memory cells of a page are operated on in parallel. Therefore a corresponding number of sense modules 210 are in operation in parallel. In one embodiment, a page controller (not shown) expediently provides control and timing signals to the sense modules operated in parallel. For more details regarding sense modules 210 and their operation, see U.S. patent application Ser. No. 11/099,133, entitled "Compensating For Coupling During Read Operations Of Non-Volatile Memory," filed Apr. 5, 2005, incorporated by reference in its entirety. Additional information about the structure and/or operations of various embodiments of non-volatile storage devices can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. patent application Ser. No. 11/015,199 titled "Improved Memory Sensing Circuit And Method For Low Voltage Operation," Inventor Raul-Adrian Cernea, filed on Dec. 16, 2004; (4) U.S. patent application Ser. No. 11/099,133, titled "Compensating for Coupling During Read Operations of Non-Volatile Memory," Inventor Jian Chen, filed on Apr. 5, 2005; and (5) U.S. patent application Ser. No. 11/321,953, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

In one embodiment, data is programmed to memory cells along a common word line. This word line may be referred to as a selected word line. The remaining word lines of a block are referred to as unselected word lines. The selected word line may have one or two neighboring word lines. If the selected word line has two neighboring word lines, then the neighboring word line on the drain side is referred to as the drain side neighboring word line and the neighboring word line on the source side is referred to as the source side neighboring word line. For example, if WL2 of FIG. 2 is the selected word line, then WL1 is the source side neighboring word line and WL3 is the drain side neighboring word line.

Figure 6:
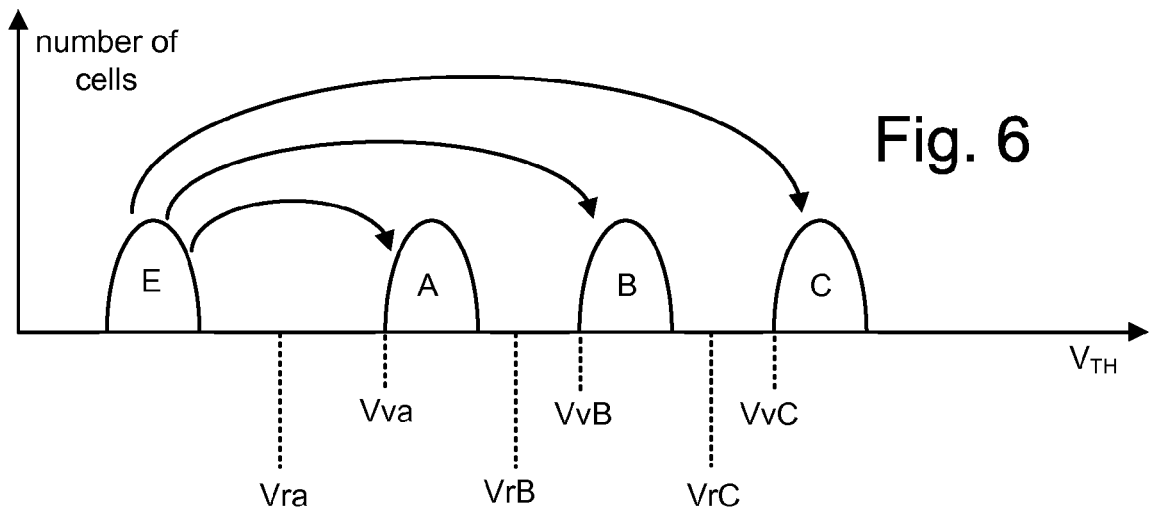
FIG. 6 depicts an exemplary set of threshold voltage distributions and a full sequence programming process.

At the end of a successful program process, the threshold voltages of the memory cells should be within one or more distributions of threshold voltages for programmed memory cells or within a distribution of threshold voltages for erased memory cells, as appropriate. FIG. 6 illustrates threshold voltage distributions for a group of memory cells when each memory cell stores two bits of data. FIG. 6 shows a first threshold voltage distribution E for erased memory cells and three threshold voltage distributions, A, B and C for programmed memory cells. In one embodiment, the threshold voltages in the E distribution are negative and the threshold voltages in the A, B and C distributions are positive.

Each distinct threshold voltage range of FIG. 6 corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a gray code assignment so that if the threshold voltage of a floating gate erroneously shifts to its neighboring physical state, only one bit will be affected. However, in other embodiments, gray coding is not used. One example assigns "11" to threshold voltage range E (state E), "10" to threshold voltage range A (state A), "00" to threshold voltage range B (state B) and "01" to threshold voltage range C (state C). Although FIG. 6 shows four states, embodiments in accordance with the present disclosure can also be used with other binary or multi-state structures including those that include more or less than four states.

FIG. 6 shows three read reference voltages, Vra, Vrb and Vrc, for reading data from the memory cells. By testing whether the threshold voltage of a given memory cell is above or below Vra, Vrb and Vrc, the system can determine what state the memory cell is in. If a memory cell conducts with Vra applied to its control gate, then the memory cell is in state E. If a memory cell conducts at Vrb and Vrc but not at Vra, then the memory cell is in state A. If the memory cell conducts at Vrc but not at Vra and Vrb, then the memory cell is in state B. If the memory cell does not conduct at Vra, Vrb or Vrc, then the memory cell is in state C. FIG. 6 also shows three verify reference voltages, Vva, Vvb and Vvc. When programming memory cells to state A, the system tests whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc.

FIG. 6 also depicts a full sequence programming technique. In full sequence programming, memory cells are programmed from the erased state E directly to any of the programmed states A, B or C. A population of memory cells to be programmed may first be erased so that all the memory cells are in erased state E. A series of program voltage pulses is then applied to the control gates of the selected memory cells to program the memory cells directly into states A, B or C. While some memory cells are being programmed from state E to state A, other memory cells are being programmed from state E to state B and/or from state E to state C.

Figure 7:
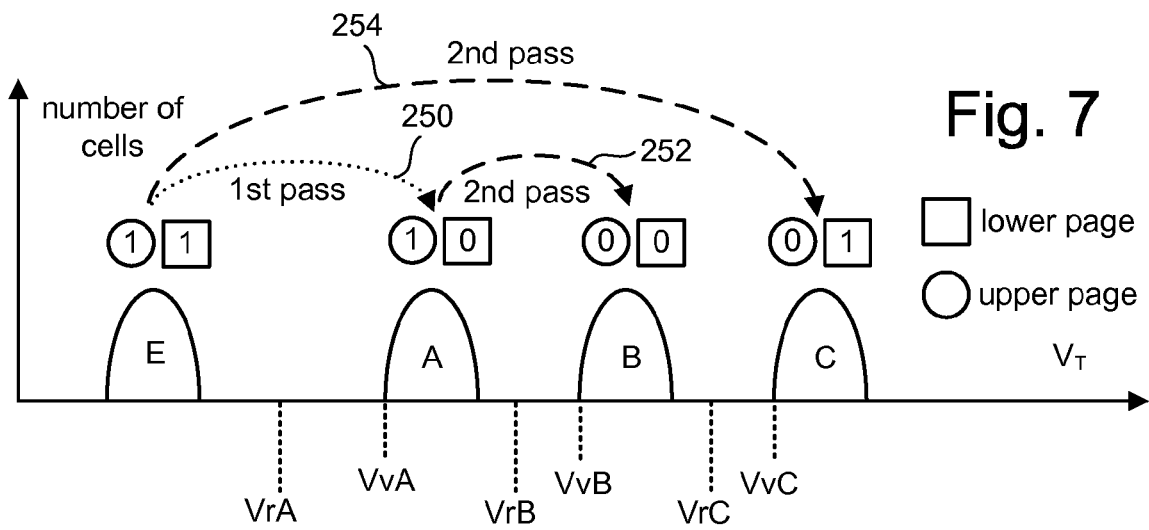
FIG. 7 depicts an exemplary set of threshold voltage distributions and an upper page/lower page programming process.

FIG. 7 illustrates an example of a two-pass technique of programming multi-state memory cells that store data for two different pages: a lower page and an upper page. Four states are depicted. For state E, both pages store a "1." For state A, the lower page stores a 0 and the upper page stores a 1. For state B, both pages store 0. For state C, the lower page stores 1 and the upper page stores 0. Although specific bit patterns have been assigned to each of the states, different bit patterns may be assigned.

In a first programming pass, the cell's threshold voltage level is set according to the bit to be programmed into the lower logical page. If that bit is a logic 1, the threshold voltage is not changed since it is in the appropriate state as a result of having been earlier erased. However, if the bit to be programmed is a logic 0, the threshold level of the cell is increased to be state A, as shown by arrow 250. That concludes the first programming pass.

In a second programming pass, the cell's threshold voltage level is set according to the bit being programmed into the upper logical page. If the upper logical page bit is to store a logic 1, then no programming occurs since the cell is in one of the states E or A, depending upon the programming of the lower page bit, both of which carry an upper page bit of 1. If the upper page bit is to be a logic 0, then the threshold voltage is shifted. If the first pass resulted in the cell remaining in the erased state E, then in the second pass the cell is programmed so that the threshold voltage is increased to be within state C, as depicted by arrow 254. If the cell had been programmed into state A as a result of the first programming pass, then the memory cell is further programmed in the second pass so that the threshold voltage is increased to be within state B, as depicted by arrow 252. The result of the second pass is to program the cell into the state designated to store a logic "0" for the upper page without changing the data for the lower page.

Figure 8A:
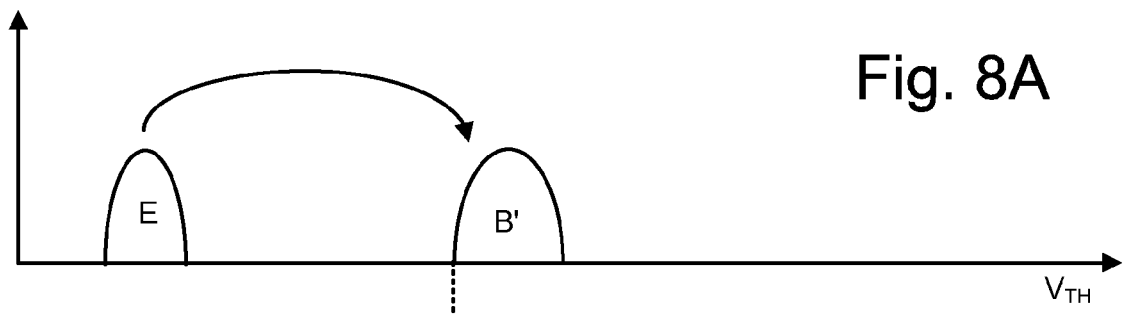
FIGS. 8A-8C depict an exemplary set of threshold voltages and a two-pass programming process.
Figure 8B:
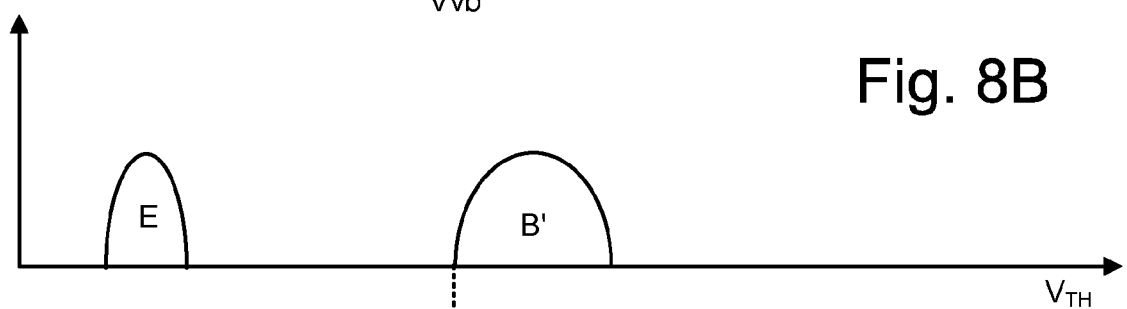
Figure 8C:
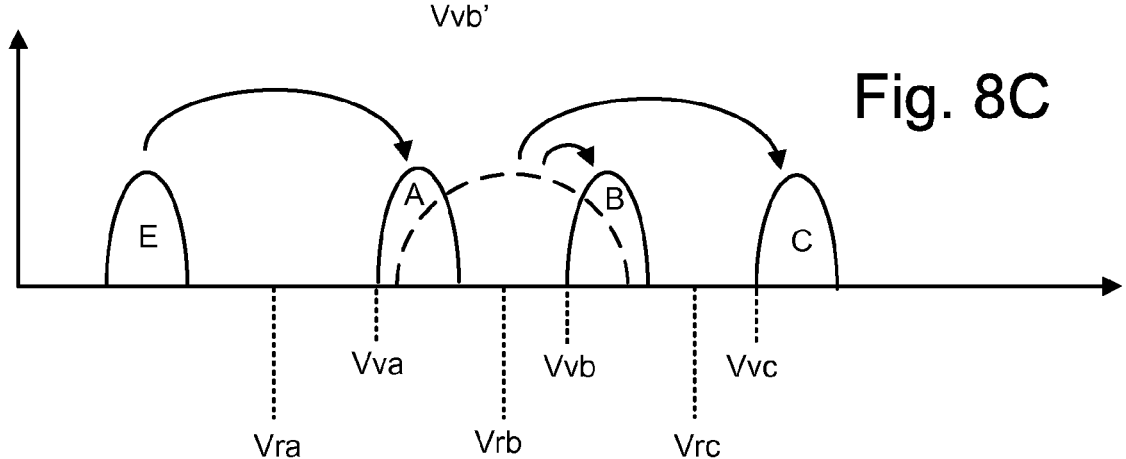

FIGS. 8A-8C disclose a process for programming non-volatile memory that reduces floating gate to floating gate coupling by, for any particular memory cell, writing to that particular memory cell with respect to a particular page subsequent to writing to adjacent memory cells for previous pages. This technique may be referred to herein as the last first mode (LM) of programming. In the example of FIGS. 8A-8C, each cell stores two bits of data per memory cell, using four data states. Erased state E stores data 11, state A stores data 01, state B stores data 10, and state C stores data 00. Other encodings of data to physical data states can also be used. Each memory cell stores a portion of two logical pages of data. For reference purposes, these pages are called upper page and lower page but can be given other labels. State A is encoded to store bit 0 for the upper page and bit 1 for the lower page, state B is encoded to store bit 1 for the upper page and bit 0 for the lower page, and state C is encoded to store bit 0 for both pages. The lower page data for memory cells at a word line WLn are programmed in a first step depicted in FIG. 8A and upper page data for the cells is programmed in a second step depicted in FIG. 8C. If the lower page data is to remain data 1 for a cell, then the cell's threshold voltage remains at state E during the first step. If the lower page data is to be programmed to 0, then the threshold voltage of the memory cell is raised to state B'. State B' is an interim state B having a verify level Vvb', which is lower than Vvb.

In one embodiment, after the lower page data for the memory cell is programmed, the neighboring memory cells at adjacent word line WLn+1 will be programmed with respect to their lower page. For example, the lower page for memory cells at WL2 in FIGS. 1-3 may be programmed after the lower page for memory cells at WL1. Floating gate coupling may raise the apparent threshold voltage of memory cell 12 if the threshold voltage of memory cell 10 is raised from state E to state B' after programming memory cell 12. The cumulative coupling effect on the memory cells at WLn will widen the apparent threshold voltage distribution of threshold voltages for the cells, as depicted as in FIG. 8B. The apparent widening of the threshold voltage distribution can be remedied when programming the upper page for the word line of interest, as shown in FIG. 8C.

FIG. 8C depicts the process of programming the upper page for the cell at WLn. If a memory cell is in erased state E and its upper page bit is to remain at 1, the memory cell remains in state E. If the memory cell is in state E and its upper page data bit is to be programmed to 0, the threshold voltage of the memory cell is raised to be within the range for state A. If the memory cell was in intermediate threshold voltage distribution B' and its upper page data is to remain 1, the memory cell is programmed to final state B. If the memory cell is in intermediate threshold voltage distribution B' and its upper page data is to become data 0, the threshold voltage of the memory cell is raised to be within the range for state C. The process depicted by FIGS. 8A-8C reduces the effect of floating gate coupling because only the upper page programming of neighbor memory cells will effect the apparent threshold voltage of a given memory cell. An example of an alternate state coding for this technique is to move from intermediate state B' to state C when the upper page data is a 1, and to move to state B when the upper page data is 0. Although FIGS. 8A-8C provide an example with respect to four data states and two pages of data, the concepts can be applied to other implementations with more or less than four states and different numbers of pages.

FIG. 9 is a timing diagram depicting the behavior of various signals during one iteration of a read or verify process. Each iteration of the process of FIG. 9 represents a single sense operation for each cell memory. If the memory cells are binary memory cells, the process of FIG. 9 may be performed once. If the memory cells are multi-state memory cells with four states (e.g., E, A, B, and C), the process of FIG. 9 may be performed three times (three sense operations) for each memory cell.

In general, during the read and verify operations, the selected word line is connected to a read reference voltage, a level of which is specified for each read and verify operation in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a particular value, then it is assumed that the memory cell turned on and the voltage applied to the word line is greater than the threshold voltage of the memory cell. If the conduction current is not measured to be greater than the particular value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges a dedicated capacitor in the sense amplifier. In another example, the conduction current of the selected memory cell allows (or fails to allow) the NAND string that included the memory cell to discharge the bit line. The charge on the bit line is measured after a period of time to see whether it has been discharged or not.

FIG. 9 shows signals SGD, WL_unsel. WLn+1, WLn, SGS, Selected BL, BLCLAMP, and Source starting at Vss (approximately 0 volts). SGD is the gate selection line of the drain side select gate. SGS is the gate selection line of the source side select gate. WLn is the word line selected for reading/verification. WLn+1 is the unselected word line that is the drain side neighboring word line to WLn. WL_unsel represents the unselected word lines other than the drain side neighboring word line. Selected BL is the bit line selected for reading/verification. Source is the source line for the memory cells (see FIG. 3). BLCLAMP is an analog signal that sets the value of the bit line when charged from the sense amplifier. Note that there are two versions of SGS, Selected BL and BLCLAMP depicted. One set of these signals SGS (B), Selected BL (B) and BLCLAMP (B) depict a read/verify operation for an array of memory cells that measure the conduction current of a memory cell by determining whether the bit line has discharged. Another set of these signals SGS (C), Selected BL (C) and BLCLAMP (C) depict a read/verify operation for an array of memory cells that measure the conduction current of a memory cell by the rate it discharges a dedicated capacitor in the sense amplifier.

First, the behavior of the sensing circuits and the array of memory cells that are involved in measuring the conduction current of a memory cell by determining whether the bit line has discharged will be discussed with respect to SGS (B), Selected BL (B), and BLCLAMP (B). At time t1 of FIG. 9, SGD is raised to Vdd (e.g., approximately 3.5 volts), the unselected word lines (WL_unsel) are raised to Vread (e.g., approximately 5.5 volts), the drain side neighboring word line (WLn+1) is raised to VreadX, the selected word line WLn is raised to Vcgr (e.g., Vra, Vrb, or Vrc of FIGS. 6, 7, and 8A-8C)) for a read operation or a verify level (e.g., Vva, Vvb, or Vvc of FIG. 11) for a verify operation, and BLCLAMP (B) is raised to a pre-charging voltage to pre-charge the selected bit line Selected BL(B) (e.g., to approximately 0.7V). The voltages Vread and VreadX act as pass voltages because they cause the unselected memory cells to turn on (regardless of physical state or threshold voltage) and act as pass gates. At time t2, BLCLAMP (B) is lowered to Vss so the NAND string can control the bit line. Also at time t2, the source side select gate is turned on by raising SGS (B) to Vdd. This provides a path to dissipate the charge on the bit line. If the threshold voltage of the memory cell selected for reading is greater than Vcgr or the verify level applied to the selected word line WLn, then the selected memory cell will not turn on and the bit line will not discharge, as depicted by signal line 260. If the threshold voltage in the memory cell selected for reading is below Vcgr or below the verify level applied to the selected word line WLn, then the memory cell selected for reading will turn on (conduct) and the bit line voltage will dissipate, as depicted by curve 262. At some point after time t2 and prior to time t3 (as determined by the particular implementation), the sense amplifier will determine whether the bit line has dissipated a sufficient amount. In between t2 and t3, BLCLAMP (B) is raised to let the sense amplifier measure the evaluated BL voltage and then lowered. At time t3, the depicted signals will be lowered to Vss (or another value for standby or recovery). Note that in other embodiments, the timing of some of the signals can be changed (e.g. shift the signal applied to the neighbor).

Next, the behavior of the sensing circuits and the array of memory cells that measure the conduction current of a memory cell by the rate it discharges a dedicated capacitor in the sense amplifier will be discussed with respect to SGS (C), Selected BL (C) and BLCLAMP (C). At time t1 of FIG. 9, SGD is raised to Vdd (e.g., approximately 3.5 volts), the unselected word lines (WL_unsel) are raised to Vread (e.g., approximately 5.5 volts), the drain side neighboring word line (WLn+1) is raised to VreadX, the selected word line WLn is raised to Vcgr (e.g., Vra, Vrb, or Vrc of FIG. 11) for a read operation or a verify level (e.g., Vva, Vvb, or Vvc of FIG. 11) for a verify operation, and BLCLAMP (C) is raised. In this case, the sense amplifier holds the bit line voltage constant regardless of what the NAND sting is doing, so the sense amplifier measures the current flowing with the bit line "clamped" to that voltage. Therefore, BLCLAMP (C) rises at t1 and does not change from t1 to t3. At some point after time t1 and prior to time t3 (as determined by the particular implementation), the sense amplifier will determine whether the capacitor in the sense amplifier has dissipated a sufficient amount. At time t3, the depicted signals will be lowered to Vss (or another value for standby or recovery). Note that in other embodiments, the timing of some of the signals can be changed.

Figure 10:
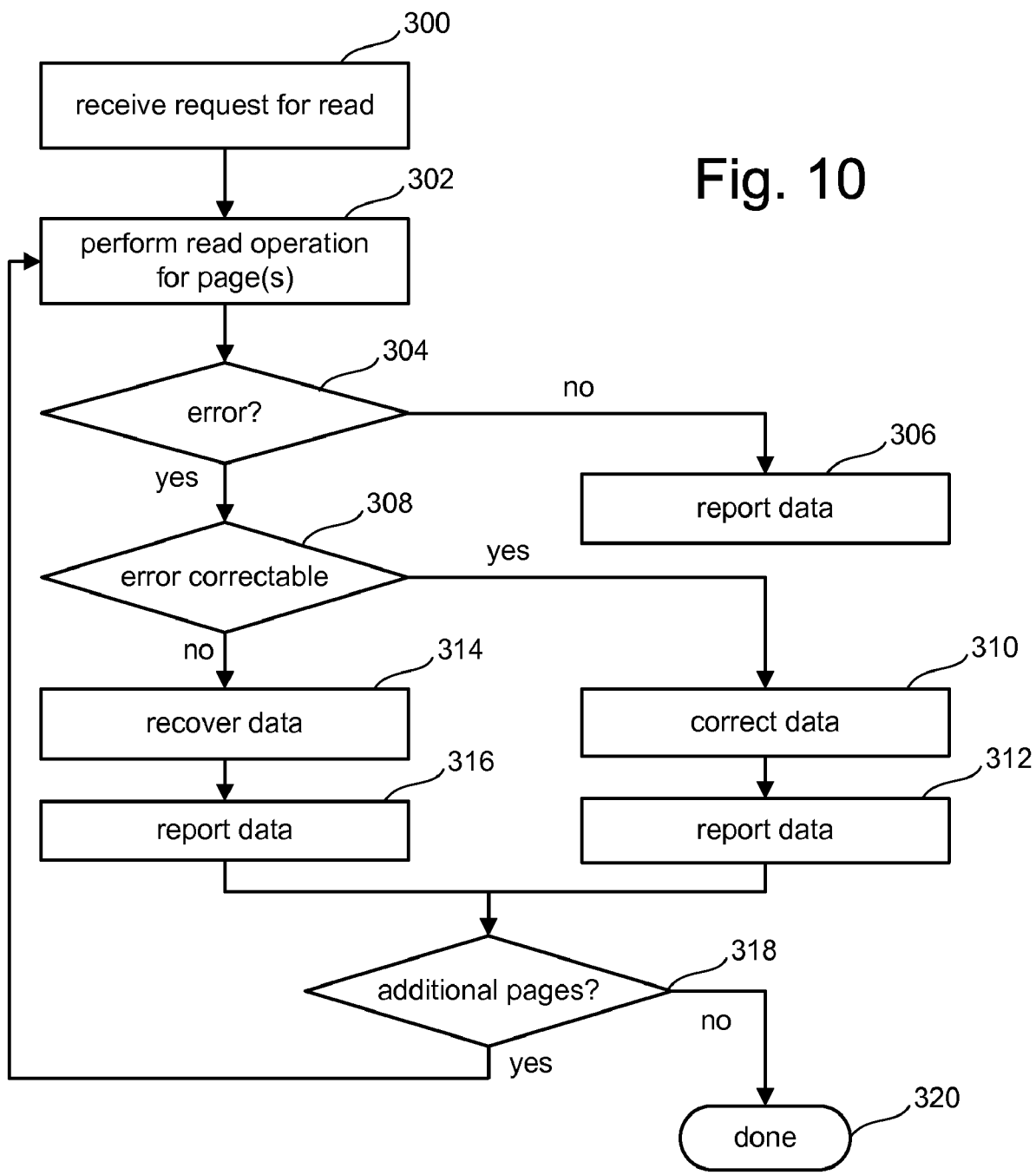
FIG. 10 is a flow chart of one embodiment for reading non-volatile memory.

FIG. 10 is a flow chart describing one embodiment for reading data from non-volatile memory cells, such as those programmed according to the techniques of FIG. 6, 7, or 8A-8C. FIG. 10 provides the read process at the system level. At step 300, a request to read data is received. At step 302, a read operation is performed for a particular page in response to the request to read data. In one embodiment, when data for a page is programmed, the system will also create extra bits used for Error Correction Codes (ECCs) and write those ECC bits along with the page of data. ECC technologies are well known in the art. The ECC process used can include any suitable ECC process known in the art. When reading data from a page, the ECC bits will be used to determine whether there are any errors in the data at step 304. The ECC process can be performed by the controller, the state machine or elsewhere in the system. If there are no errors in the data, the data is reported to the user at step 306. If an error is found at step 304, it is determined whether the error is correctable at step 308. The error may be due to floating gate to floating gate coupling or other reasons. Various ECC methods have the ability to correct a predetermined number of errors in a set of data. If the ECC process can correct the data, then the ECC process is used to correct that data at step 310 and the data, as corrected, is reported to the user at step 312. If the data is not correctable by the ECC process, a data recovery process is performed at step 314. In some embodiments, an ECC process will be performed after step 314. More details about the data recovery process are described below. After the data is recovered, that data is reported at step 316. At step 318, the process loops back to step 302 if additional pages are to be read or ends at step 320. Note that the process of FIG. 15 can be used with data programmed using all bit line programming or odd/even bit line programming.

Figure 11:
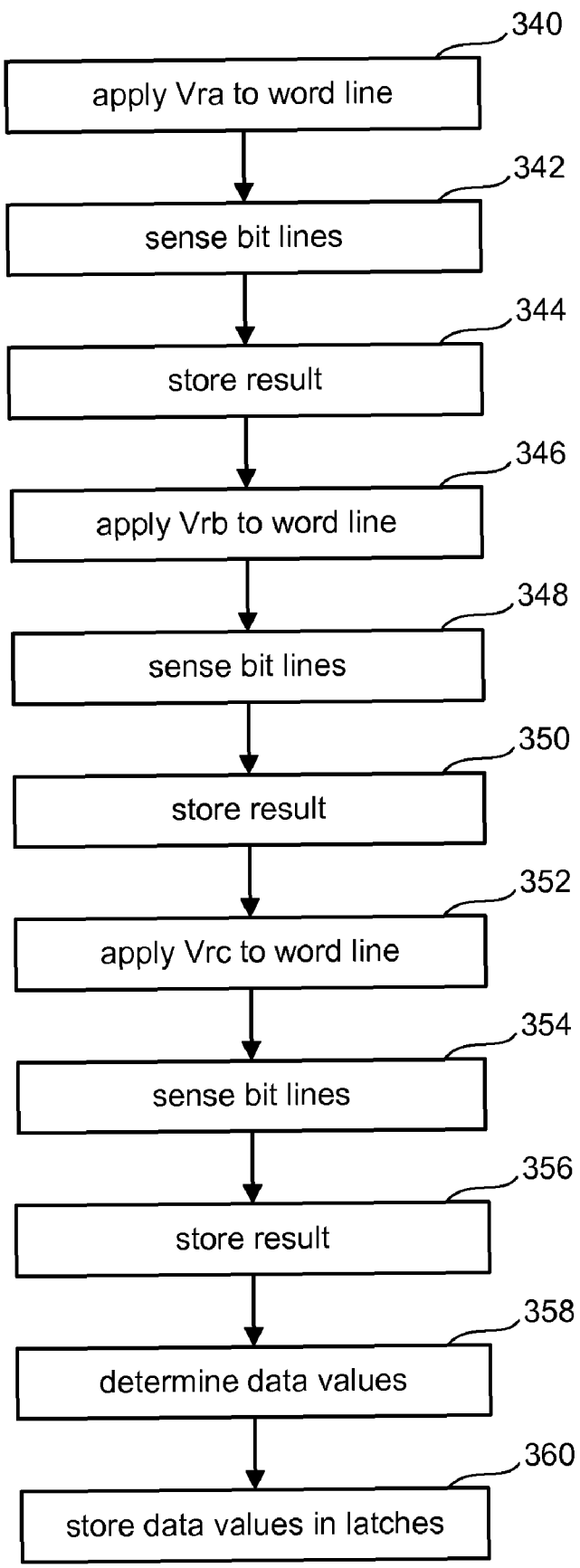
FIG. 11 is a flow chart of one embodiment for performing a read operation for non-volatile memory.

FIG. 11 is a flow chart describing one embodiment of a process for performing a read operation for a page (step 302 of FIG. 10). The process of FIG. 11 can be performed for a page that encompasses all bit lines of a block, only odd bit lines of a block, only even bit lines of a block, or other subsets of bit lines of a block. At step 340, read reference voltage Vra is applied to the appropriate word line associated with the page. At step 342, the bit lines associated with the page are sensed to determine whether the addressed memory cells turn on or do not turn on based on the application of Vra to their control gates. Bit lines that conduct indicate that the memory cells were turned on; therefore, the threshold voltages of those memory cells are below Vra (e.g., in state E). At step 344 the result of the sensing for the bit lines is stored in the appropriate latches (e.g., latches 202) for those bit lines. At step 346, read reference voltage Vrb is applied to the word lines associated with the page being read. At step 348, the bit lines are sensed as described above. At step 350, the results are stored in the appropriate latches for the bit lines. At step 352, read reference voltage Vrc is applied to the word lines associated with the page. At step 354, the bit lines are sensed to determine which memory cells turn on, as described above. At step 356, the results from the sensing step are stored in the appropriate latches for the bit lines. At step 358, the data values for each bit line are determined. For example, if a memory cell conducts at Vra, then the memory cell is in state E. If a memory cell conducts at Vrb and Vrc but not at Vra, then the memory cell is in state A. If the memory cell conducts at Vrc but not at Vra and Vrb, then the memory cell is in state B. If the memory cell does not conduct at Vra, Vrb or Vrc, then the memory cell is in state C. In one embodiment, the data values are determined by processor 212. At step 360, processor 212 will store the determined data values in the appropriate latches (e.g., latches 214) for each bit line. In other embodiments, sensing the various levels (Vra, Vrb, and Vrc) may occur in different orders.

Steps 340-344 can include performing the operation depicted in FIG. 9, with Vcgr=Vra and VreadX=Vread. Steps 346-350 can include performing the operation depicted in FIG. 9, with Vcgr=Vrb and VreadX=Vread. Steps 352-356 can include performing the operation depicted in FIG. 9, with Vcgr=Vrc and VreadX=Vread.

Floating gate coupling can cause errors during read operations. The charge stored on the floating gate of a memory cell can undergo an apparent shift because of electrical field coupling associated with charge stored at a neighboring memory cell's floating gate or other charge storage region (e.g., dielectric charge storage region). While in theory the electric field from a charge on the floating gate of any memory cell in a memory array can couple to the floating gate of any other memory cell in the array, the effect is most pronounced and noticeable with adjacent memory cells. Adjacent memory cells may include neighboring memory cells that are on the same bit line, neighboring memory cells on the same word line, or neighboring memory cells that are on both a neighboring bit line and neighboring word line, and thus, adjacent from each other in a diagonal direction. The apparent shift in charge can result in errors when reading the memory state of a memory cell.

The effects of floating gate coupling are most pronounced in situations where a memory cell adjacent a target memory cell is programmed subsequent to the target memory cell, although its effects may be seen in other situations as well. A charge placed on the floating gage of an adjacent memory cell, or a portion of the charge, will effectively be coupled to the target memory cell through electrical field coupling, resulting in an apparent shift of the threshold voltage of the target memory cell. A memory cell's apparent threshold voltage can be shifted to such a degree after being programmed that it will not turn on and off (conduct) under the applied read reference voltages as expected for a memory cell in the memory state to which it was intended to be programmed.

Typically, rows of memory cells are programmed starting with the word line (WL0) adjacent to the source side select gate line. Programming proceeds sequentially thereafter by word line (WL1, WL2, WL3, etc.) through the strings of cells such that at least one page of data is programmed in an adjacent word line (WLn+1) after completing programming (placing each cell of the word line into its final state) of the preceding word line (WLn). This pattern of programming results in an apparent shift of the threshold voltage of memory cells after being programmed due to floating gate coupling. For every word line except the last word line of a NAND string to be programmed, an adjacent word line is programmed subsequent to completing programming of the word line of interest. The negative charge added to the floating gates of memory cells on the adjacent, later programmed word line raises the apparent threshold voltage of the memory cells on the word line of interest.

Figure 12:
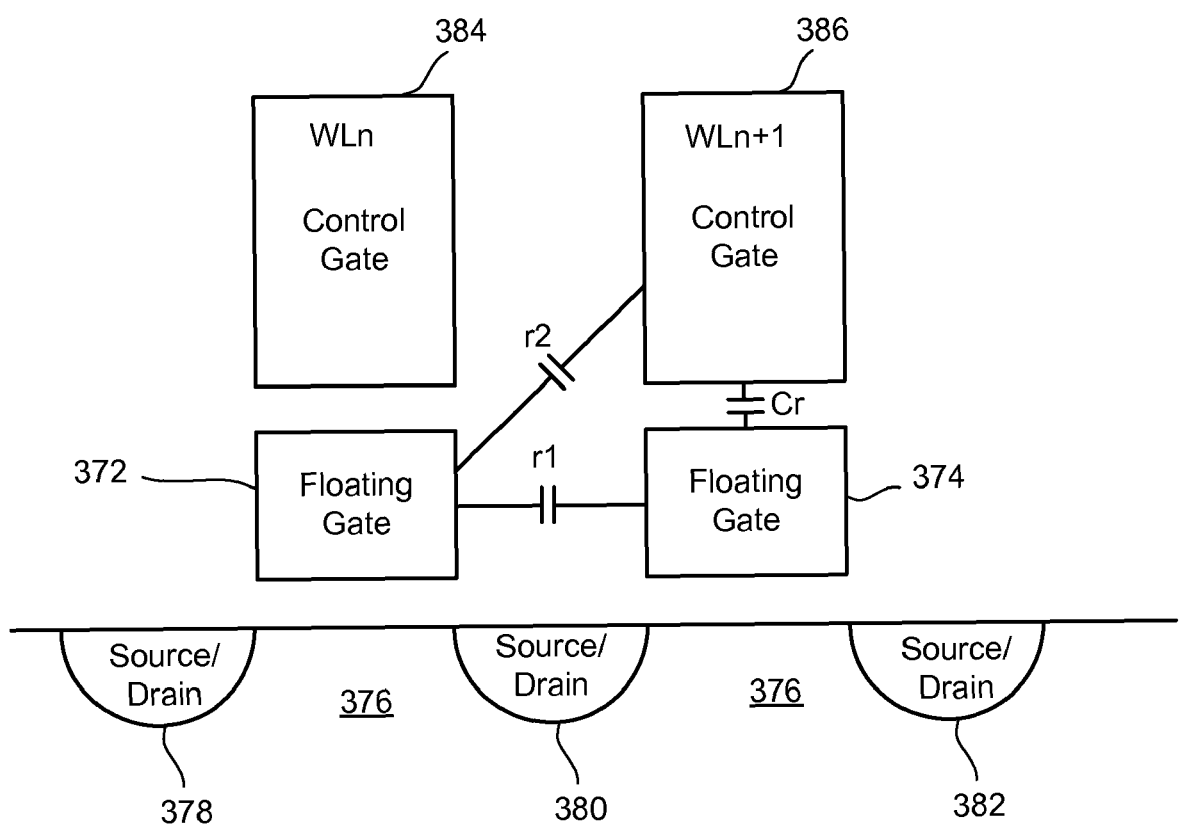
FIG. 12 is a block diagram illustrating capacitive coupling between two neighboring memory cells.

FIG. 12 graphically explains the concept of floating gate to floating gate coupling. FIG. 12 depicts neighboring floating gates 372 and 374, which are on the same NAND string. Floating gates 372 and 374 are situated above NAND channel/substrate 376, which has source/drain regions 378, 380 and 382. Above floating gate 372 is control gate 384 that is connected to and part of word line WLn. Above floating gate 374 is control gate 386 that is connected to and part of word line WLn+1. Although floating gate 372 will likely be subject to coupling from multiple other floating gates, for simplicity FIG. 12 only shows the effects from one neighboring memory cell. FIG. 12 shows three components of coupling provided to floating gate 372 from its neighbor: r1, r2 and Cr. The component r1 is the coupling ratio between the neighboring floating gates (372 and 374), and is calculated as the capacitance of the neighboring floating gates divided by the sum of all capacitive couplings of floating gate 372 to all the other electrodes surrounding it. The component r2 is the coupling ratio between the floating gate 372 and the drain side neighbor control gate 386, and is calculated as the capacitance of floating gate 372 and control gate 386 divided by the sum of all capacitive couplings of floating gate 372 to all the other electrodes surrounding it. The component Cr is the control gate coupling ratio and is calculated as the capacitance between floating gate 374 and its corresponding control gate 386 divided by the sum of all capacitive couplings of floating gate 372 to all the other electrodes surrounding it.

Figure 13:
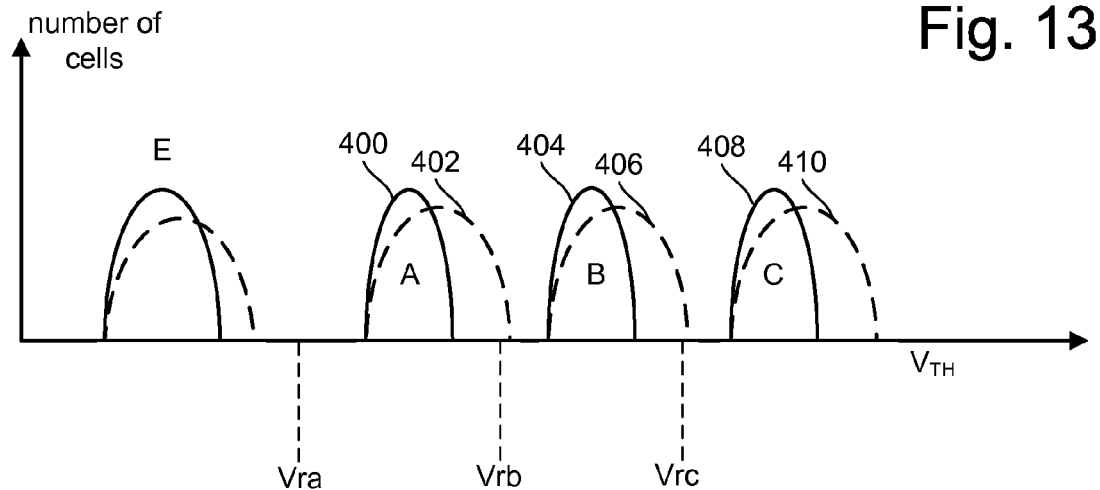
FIG. 13 is an exemplary set of threshold voltage distributions illustrating the effects of floating gate coupling.

FIG. 13 shows the apparent threshold voltage distributions for a row of memory cells (e.g., WLn) before (solid curves) and after (dotted curves) its adjacent neighboring row (WLn+1) is programmed. Each distribution is widened as a result of adding negative charge to the floating gates of the memory cells of the adjacent word line. Because of floating gate coupling, the negative charge of a later programmed memory cell on WLn+1 will raise the apparent threshold voltage of a memory cell on WLn that is connected to the same bit line. Distributions 400 and 402 represent the cells of a selected word line WLn in state A before and after programming the adjacent word line WLn+1, respectively. Distributions 404 and 406 represent the cells of WLn in state B before and after programming WLn+1, respectively. Distributions 408 and 410 represent the cells of WLn in state C after programming WLn+1, respectively. Because the distributions are widened, memory cells may be read incorrectly as in an adjacent state. Memory cells at the upper end of each distribution can have an apparent threshold voltage above a corresponding read compare point. For example, when applying reference voltage Vrb, certain memory cells programmed to state A, may not conduct sufficiently because of the shift in their apparent threshold voltage. These cells may incorrectly be read as in state B, causing read errors. The later programmed cells can also effect the apparent threshold voltage of memory cells of WLn that are connected to different bit lines, such as those connected to adjacent bit lines.

Figure 14:
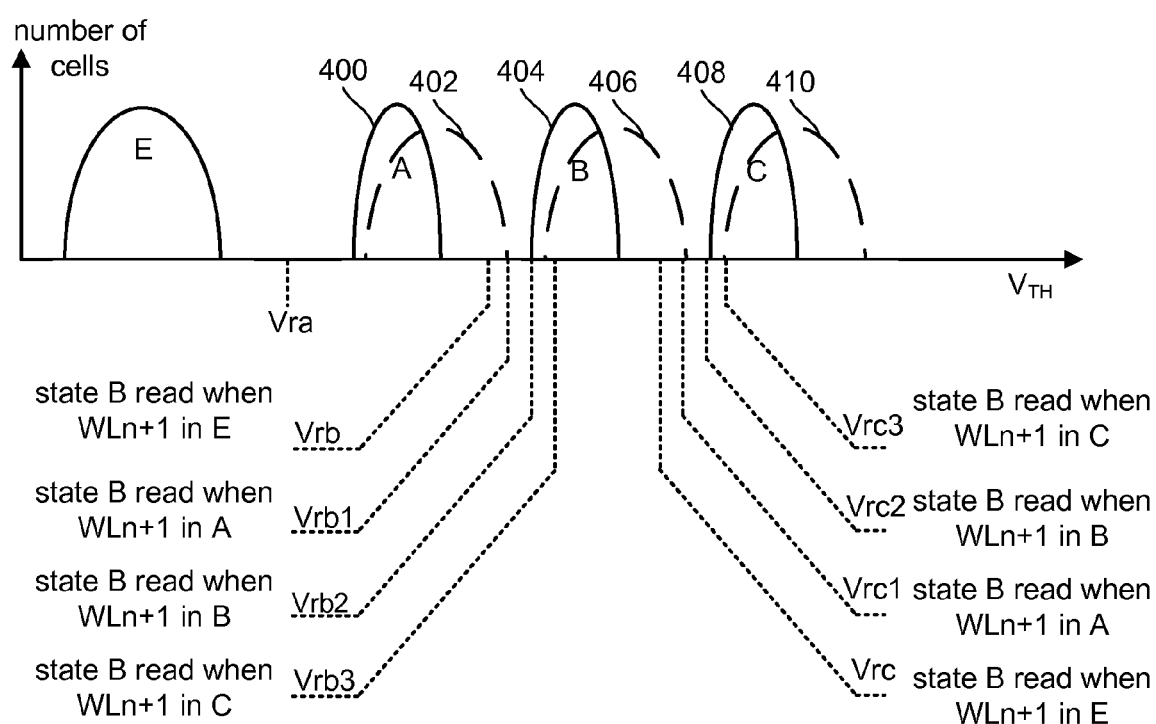
FIG. 14 is an exemplary set of threshold voltage distributions illustrating a technique for compensating for floating gate coupling.
Figure 15:
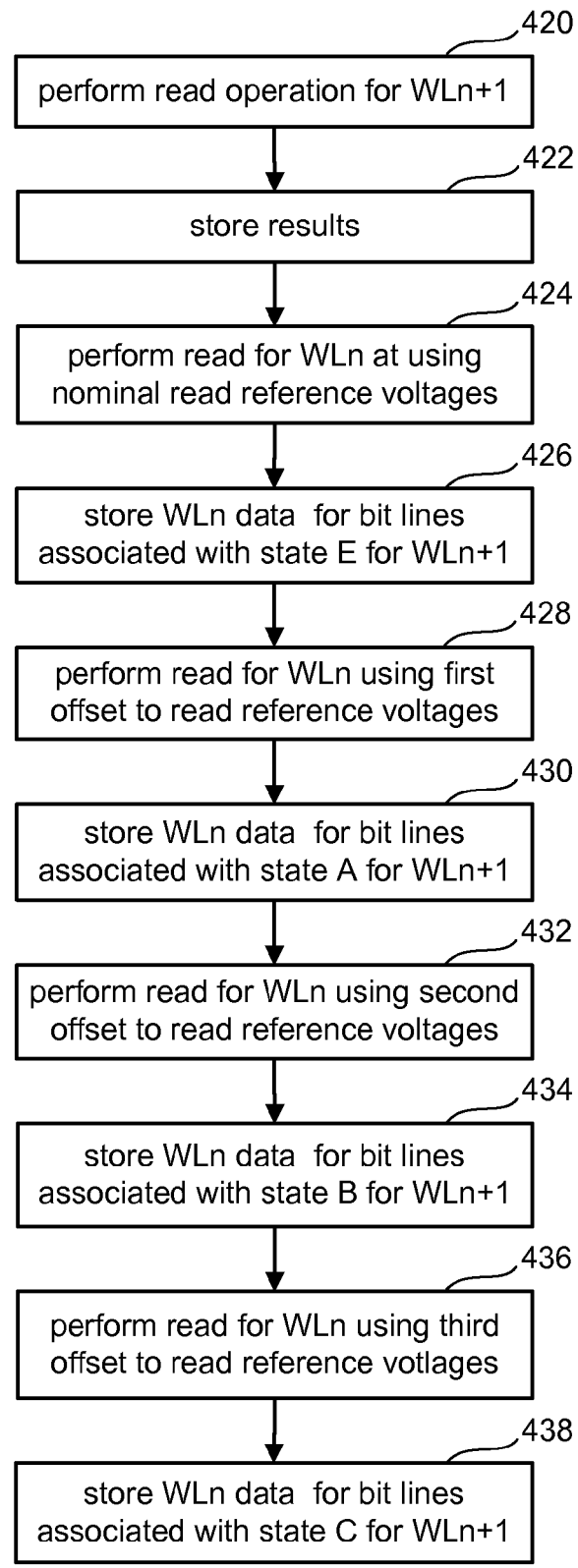
FIG. 15 is a flowchart for compensating for floating gate coupling using the technique of FIG. 14.

FIG. 14 graphically depicts a reading technique that can be used to address some of the apparent shifts in threshold voltages illustrated in FIG. 13. FIG. 15 is a flowchart describing this technique. When reading data on word line WLn, the data of word line WLn+1 can also be read (step 420), and if the data on word line WLn+1 has disturbed the data on WLn, the read process for WLn can compensate for that disturb. For example, when reading word line WLn, state or charge level information for the memory cells at word line WLn+1 can be determined in order to select appropriate read reference voltages for reading individual memory cells of word line WLn. The process of FIG. 11 can be used to read WLn+1. FIG. 14 depicts individual read reference voltages for reading WLn based on the state of an adjacent memory cell at word line WLn+1. In general, different offsets (e.g., 0V, 0.1V, 0.2V, 0.3V) to the nominal read reference voltages Vra, Vrb, and Vrc are used and the results of sensing at different offsets selected as a function of the state of a memory cell on a neighboring word line. In one embodiment, the memory cells at word line WLn are sensed using each of the different read reference voltages including offsets. For a given memory cell, the results from sensing at an appropriate one of the read reference voltages can be selected based upon the state of an adjacent memory cell at word line WLn+1.

In some embodiments, the read operation for WLn+1 determines the actual data stored at WLn+1, while in other embodiments, the read operation for WLn+1 only determines the charge levels of these cells, which may or may not accurately reflect the data stored at WLn+1. In some embodiments, the levels and/or the number of levels used to read WLn+1 may not be exactly the same as those used to read WLn. Some approximation of the floating gate threshold value can be sufficient for WLn correction purposes in some implementations. In one embodiment, the results of reading at WLn+1 can be stored in latches 214 at each bit line to be used when reading WLn (step 422).

A read operation can first be performed for the word line of interest WLn at the nominal read reference voltage levels Vra, Vrb, and Vrc which do not compensate for any coupling effects (step 424). The results of reading at the nominal reference levels are stored in the appropriate latches for bit lines with memory cells where the neighboring cell at WLn+1 was determined to be in state E (step 426). For other bit lines, the data is disregarded and the WLn+1 data maintained. A read operation is then performed for word line WLn using a first set of offsets to the read reference voltages at step 428. The read process can use Vra1 (Vra+0.1V), Vrb1 (Vrb+0.1V) and Vrc1 (Vrc+0.1V) in the process of FIG. 11. The results from using these reference values are stored for bit lines with memory cells having neighboring memory cells at WLn+1 in state A at step 430. Data for other bit lines is disregarded. A read operation is then performed at step 432 with a second set of offsets using read reference levels Vra2 (Vra+0.2V), Vrb2 (Vrb+0.2V) and Vrc2 (Vrc+0.2V) in the process of FIG. 11. The results are stored in latches for bit lines with memory cells having neighbors at WLn+1 in state B at step 434. Data for other bit lines is disregarded. A read operation is performed for word line WLn with a third set of offsets using reference levels Vra3 (Vra+0.3V), Vrb3 (Vrb+0.3V) and Vrc3 (Vrc+0.3V) in the process of FIG. 11 at step 436. The results are stored for those bit lines having memory cells with neighboring cells at WLn+1 in state C at step 438. In some embodiments, no offsets will be used at Vra because of the larger natural margin between state E and state A. Such an embodiment is depicted in FIG. 14 where a single read reference voltage Vra is depicted at the state A level. Other embodiments may use offsets for this level as well. The process of FIG. 15 can be used for recovering data (e.g., step 314 of FIG. 10) or as an initial read process (e.g., step 302).

The different offsets to the nominal read reference voltages can be selected as a function of the state of a memory cell on the adjacent word line. For example, a set of offset values could include a 0V offset corresponding to an adjacent cell in state E, a 0.1V offset corresponding to an adjacent cell in state A, a 0.2V offset corresponding to an adjacent cell in state B, and a 0.3V offset corresponding to an adjacent cell in state C. The offset values will vary according to implementation. In one embodiment, the offset values are equal to the amount of shift in apparent threshold voltage that results from an adjacent cell being programmed to a corresponding state. For example, 0.3V may represent the shift in apparent threshold voltage for a cell at WLn when an adjacent cell at WLn+1 is programmed to state C after programming WLn. The offset values need not be the same for every reference voltage. For example, the offset values for the Vrb reference voltage may be 0V, 0.1V, 0.2V, and 0.3V while those for the Vrc reference voltage may be 0V, 0.15V, 0.25V and 0.35V. Additionally, the increment in offsets need not be the same for every state. For example, a set of offsets in one embodiment could include 0V, 0.1V, 0.3V, and 0.4V for adjacent cells in states E, A, B, and C, respectively.

Another technique used to compensate for floating gate coupling effects provides compensation to a memory cell adjacent a selected memory cell in order to reduce the coupling effect that the adjacent memory cell has on the selected memory cell. One such embodiment includes setting up, during the verification process, the required conditions for later application of compensation to the adjacent memory cell. In such an embodiment the pass voltage, otherwise known as Vread, applied to WLn+1 is reduced from a typical value of, for example, 6V that is applied to each other in selected word line down to, for example, 3V. The compensation consists of application of higher voltage, as compared to the voltage used during the verify phase of program/verify operations, to WLn+1 during the read operation performed on WLn. The compensation can include a change/delta: ΔVread={[Vread (WLn+1 during read of WLn)]−[Vread(WLn+1 during verify of WLn)]}. The advantage of using a lower Vread value during verify is that it allows the application of nominal values of Vread later during read operations, while maintaining the required ΔVread. Had it not been for the use of a smaller than nominal value of Vread during verify, the necessary value of Vread during read that would allow the application of sufficient ΔVread would have been, for example, 6+3=9V which would have been a large voltage that could lead to read disturb conditions. One example of such setting up for later compensation is depicted in FIG. 9 as the application of VreadX to the drain side neighboring word line while the other unselected word lines receive Vread. In many prior art devices, all of the unselected word lines would receive Vread. In the embodiment of FIG. 9, all of the unselected word lines, except for the drain side neighbor, receive Vread, while the drain side neighbor receives VreadX.

For the verify process where memory cells are programmed from the source side to the drain side, it is guaranteed (in one embodiment) that when writing to word line WLn, all memory cells on word lines WLn+1 are in the erased state (e.g., state E) (Note: This is true for full sequence and not for LM mode. Please see above explanation). Word line WLn+1 will receive a voltage level VreadX, where VreadX=Vread4 (discussed below). In one embodiment, Vread4 is equal to 3.7V. In another embodiment, VreadX=Vread. In other embodiment, other values can also be used. In different implementations, different values of Vread4 or VreadX can be determined based on device characterization, experimentation and/or simulation.

In one embodiment, the amount of required compensation, ΔVread, can be calculated as follows:

$$\Delta Vread = (\Delta VTn+1) \frac{1}{1 + \frac{r2}{(r1)(Cr)}}$$

Where ΔVTn+1 is the change in threshold voltage of the drain side neighbor memory cell between the time of program/verify of WLn and the present time. ΔVTn+1, and r1 are the root causes of the word line to word line parasitic coupling effect that is mitigated by the present method. ΔVread is the compensation that is brought to bear in order to combat this effect.

Figure 16:
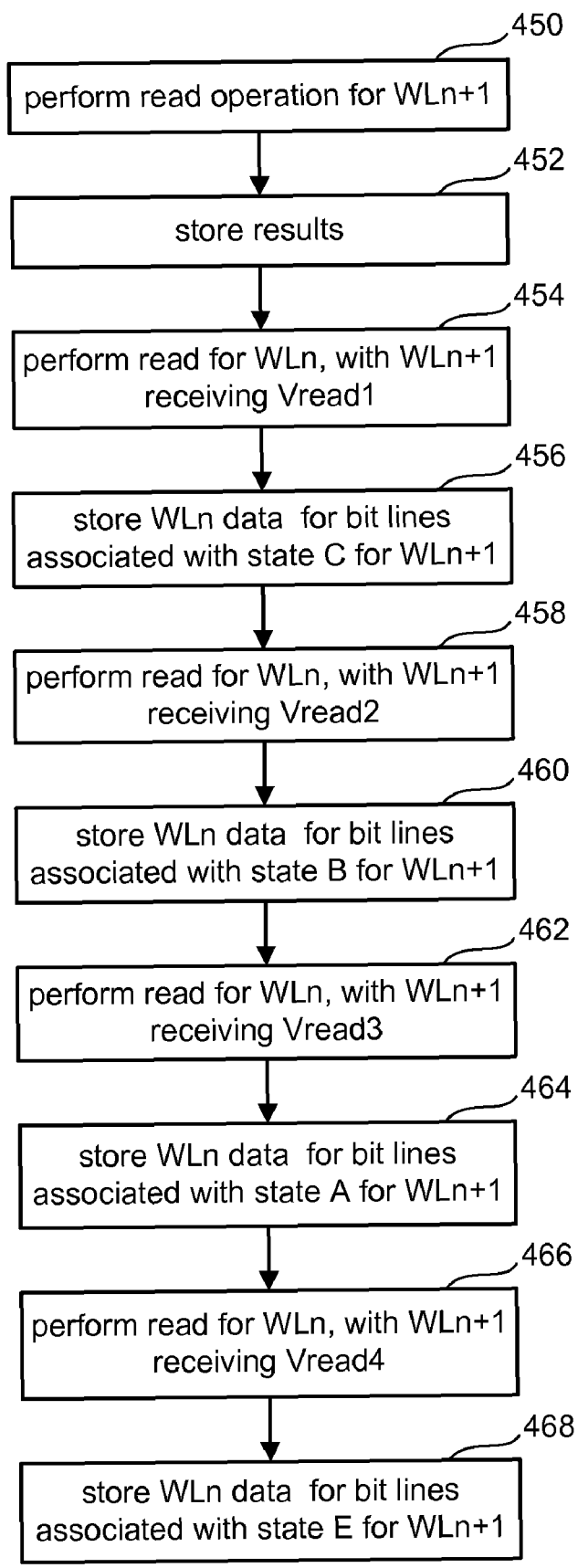
FIG. 16 is a flowchart for compensating for floating gate coupling using another technique.

FIG. 16 is a flow chart describing one embodiment of a process for performing an initial read operation (step 302) or recovering data (step 314) using the aforementioned technique. The process depicted in FIG. 16 applies to the full sequence programming described above with respect to FIG. 11 in which two bits of one logical page are stored in each cell and will be read and reported out together. A read operation for the neighboring word line WLn+1 is performed at step 450. This can include the process of FIG. 11 for the neighboring word line. The results are stored in the appropriate latches at step 452.

At step 454, a read process is performed for the word line of interest WLn. This can include performing the process of FIG. 11 with VreadX=Vread1 (FIG. 9). In one embodiment, Vread1=Vread. Thus, all of the unselected word lines (see WL_unsel and WLn+1 of FIG. 9) receive Vread. This provides the maximum compensation as the compensation is determined by the difference between Vread value used on WLn+1 now during read operations and the Vread value used earlier during the verify phase of program/verify. The compensation value, compC, can be defined as follows: compC=Vread1−Vreadp=5.5−3=2.5v, where Vreadp is the Vread value used during program/verify. The results of step 454 are stored at step 456 in the appropriate latches for bit lines with memory cells where the adjacent cell at WLn+1 was determined (at step 450) to be in state C. Therefore, the maximum compensation, CompC, is engaged for cells whose drain side neighbors had experienced the highest change in threshold voltage by being programmed from state E to state C. Note that these drain side neighbors were in State E during program/verify of WLn, but now are in state C. What has to be compensated for under all circumstances is the change in state of the drain side neighbor on WLn+1 experienced between the time of write of WLn and the present time of read of WLn. For other bit lines whose drain side neighbors are not being detected presently to be in state C, the data of this read of WLn which used Vread1 on WLn+1 will be disregarded.

At step 458, a read process is performed for WLn with the drain side neighbor word line WLn+1 receiving Vread2 (VreadX=Vread2); where Vread2, as compared to Vread1, is closer in value to the Vreadp used during program verify. A smaller compensation appropriate for cells whose drain side neighbors are now in state B is delivered. One example of a compensation is compB=Vread2−Vreadp=4.9−3=1.9V. Thus, Vread2 differs from Vreadp by compB. At step 460, the results of step 458 are stored for bit lines with memory cells having neighboring memory cells at WLn+1 in state B. Data for other bit lines is disregarded.

At step 462, a read process is performed for WLn. with word line WLn+1 receiving Vread3. (VreadX=Vread3), where Vread3, as compared to Vread2, is closer in value to Vreadp used during programming. A yet smaller compensation amount appropriate for cells whose drain side neighbors are now in state A is delivered. One example of a compensation amount is compA=Vread3−Vreadp=4.3−3=1.3V. Thus Vread3 differs from Vreadp by compA. At step 464, the results of step 462 are stored for bit lines with memory cells having neighboring memory cells at WLn+1 in state A. Data for other bit lines is disregarded.

At step 466, a read process is performed for WLn. with word line WLn+1 receiving Vread4 (VreadX=Vread4), where Vread4 is identical in value to Vreadp used during programming. This delivers no compensation which is appropriate for cells whose drain side neighbors are now in state E as they were at the time of program/verify. This compensation amount is compE=Vread4−Vreadp=3−3=0.0V. At step 468, the results of step 466 are stored for bit lines with memory cells having neighboring memory cells at WLn+1 in state E. Data for other bit lines is disregarded. During the process of FIG. 16, the neighboring bit line will receive four voltages. However, each selected memory cell of WLn being read will only make use of or select the results when sensing at the one appropriate voltage corresponding to the state of its adjacent cell at WLn+1. In different implementations, different values of Vread1, Vread2, Vread3 and Vread 4 can be determined based on device characterization, experimentation and/or simulation. For more information on the technique of FIG. 16, see U.S. patent application Ser. No. 11/384,057, entitled "Read Operation for Non-Volatile Storage with Compensation for Coupling," by Nima Mokhlesi, incorporated by reference herein in its entirety.

In typical operations involving access to a non-volatile memory system, host devices will request multiple pages of data that may span multiple word lines. Traditionally, memory systems read data from multiple word lines in the same order that the data was programmed to those word lines. Word lines are typically programmed beginning with the word line adjacent the source side select gates and ending at the word line adjacent the drain side select gates although the opposite order can be used as well. Returning to FIG. 3, the physical block comprised of the cells connected to word lines WL0 through WLi would be programmed beginning with word line WL0. After completing programming of the memory cells to word line WL0 programming would proceed to word line WL1, WL2, etc. ending with word line WLi. When a request is received to read all of the data from this physical block, the read operation will proceed in the same manner as the programming operation. Reading will begin with word line WL0 and proceed sequentially thereafter until word line WLi is reached.

Figure 17:
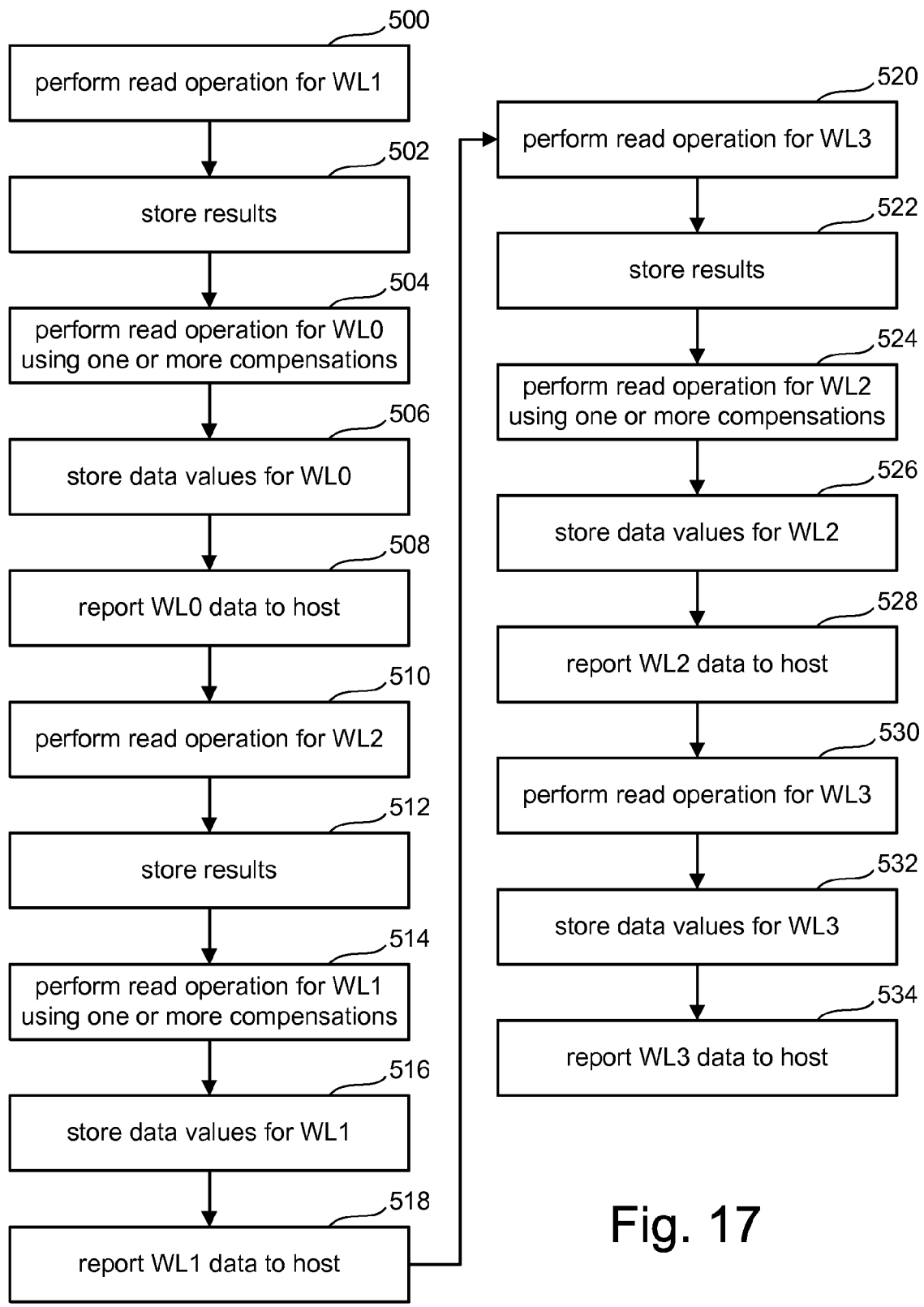
FIG. 17 is a flowchart illustrating an order of reading a set of memory cells using compensation according to the prior art.

FIG. 17 is a flowchart depicting a method for reading a physical block of data in accordance with such traditional techniques using one or more compensations. In the example of FIG. 17, a physical block is comprised of four word lines and it is assumed that programming begins at word line WL0 and ends with word line WL3. At step 500 a read operation is performed for word line WL1. No compensation is used when reading word line WL1 as this read operation is performed merely to acquire data or charge level information that can be used to more accurately read word line WL0. In one embodiment, performing the read operation for word line WL1 is performed according to the technique of FIG. 11. After performing the read operation for word line WL1 the results (data values or charge level information) are stored at step 502. In one embodiment, step 502 corresponds to step 360 of FIG. 11.

After storing results for word line WL1, WL0 is read using one or more compensations at step 504. The data values read from WL0 are stored at step 506 in the appropriate data latches 214. After performing the read operation for word line WL0 and storing the data values at step 506, the data from word line WL0 is reported to the host at step 508.

Steps 504 (and steps 514, 524 described below) can include performing a number of subreads at the selected word line in one embodiment. In one embodiment, applying one or more compensations at step 504 (514, 524) includes performing four subreads (each including three sense operations assuming four state memory cells) corresponding to steps 424, 428, 432, and 436 of FIG. 15. In another embodiment, step 504 (514, 524) include performing four subreads (each including three sense operations assuming four state memory cells) corresponding to steps 454, 458, 462, and 466 of FIG. 16.

In other embodiments, other techniques for applying one or more compensations can be used. For example, a single subread can be used in some embodiments by applying a bit line specific compensation. A bit line specific compensation, as opposed to the word line based compensations shown in FIGS. 15 and 16, can address each memory cell individually so that each memory cell simultaneously receives its appropriate compensation in parallel with each other memory cell of a common word line being read. One set of conditions is applied to the word lines while each bit line is setup based on the state of the adjacent memory cell of that bit line on the neighboring word line. In this manner, a single subread can be used. For example, the trip point voltage used to determine if a cell is conductive or non-conductive under an applied read reference voltage can be tailored for each bit line, based on the state of the adjacent cell at WLn+1 for that bit line. Other parameters such as integration time and pre-charge voltage can also be used to provide bit line specific compensation so that a single subread can be utilized. Tailoring combinations of these various parameters can be used in one embodiment.

At step 510 a read operation for word line WL2 is performed. Again step 510 can include performing the read method depicted in FIG. 11 in one embodiment. No compensation is used when reading the word line WL2 as this read operation is performed merely to acquire data or charge level information that can be used to more accurately read word line WL1. The data values or charge level information read from word line WL2 is stored at step 512. In one embodiment, step 512 corresponds to step 660 of FIG. 11. After storing the data values or charge level information for word line WL2, a read operation using one or more compensations is performed for word line WL1 at step 514. The data values determined in step 516 are stored in the appropriate data latches at step 516 and reported to the host device at step 518.

At step 520 a read operation is performed for word line WL3 which can include performing the method of FIG. 11. At step 522 the data values or charge level information are stored for word line WL3 in the appropriate latches. At step 524 a read operation including one or more compensations is performed for word line WL2. The data values for word line WL2 are stored in the appropriate latches at step 526 and reported to the host device at step 528. At step 530 a read operation is performed for word line WL3. In the example of FIG. 17 word line WL3 is the last word line to be programmed and read for the memory system. Accordingly no compensations are used at word line WL3. The data values are stored for word line WL3 at step 532 and reported to the host at step 534.

As illustrated in FIG. 17 these traditional techniques of reading in the same order in which the word lines were programmed necessitates additional read operations at the neighboring word line when reading each selected word line except the last word line. In order to read word line WL0 for example, word line WL1 must be first read in order to ascertain its data state or charge level information in order to apply the appropriate compensation while reading word line WL0. Before reading word line WL1 at step 514 for its actual data to be referred to the host, a read operation for word line WL2 must be performed. The addition of these additional read operations can affect system performance by requiring longer to complete read operations.

FIG. 18 is a table depicting the number of sense operations that are necessary in such a memory system in some embodiments. In FIG. 18, a 16 word line physical or erase block is depicted. Column 550 lists the word lines of the physical block in order, with word line WL15—the word line adjacent the drain side select gates of the physical block—at the top of the page, and word line WL0—the word line adjacent the source side select gates for the physical block—at the bottom of the page. The programming sequence for the memory cells of the word lines is depicted in column 552. Programming the physical block begins with word line WL0 and proceeds sequentially thereafter to word line WL15. The sequence for reading the physical block of data is depicted in column 554. Word line WL0 is read first, followed by word line WL1, and proceeding sequentially thereafter to word line WL15. Column 556 illustrates what is necessary to perform the read operation for each word line. In order to read word line WL0, for example, word line WL1 must first be read, as shown in column 556. After reading word line WL1 to determine its data values or charge level information, word line WL0 is read using the information from word line WL1 to apply (or select the results of) an appropriate compensation.

Column 558 sets forth the number of sense operations and subreads (SR) that are necessary for each read operation. Referring to word line WL0 again for example, when first reading word line WL1, three sense operations are performed (assuming a four state memory cell). A first sense operation is performed using the read reference level Vra, a second sense operation is performed using the second read reference voltage level Vrb and a third sense operation is performed using the third read reference voltage level Vrc. These three sense operations comprise one subread at word line WL1. After reading word line WL1, the word line of interest word line WL0 is read using the data from word line WL1 to apply or select the results at the appropriate compensation. Reading word line WL0 involves 12 sense operations corresponding to four subreads at word line WL0. A first subread includes three sense operations at the levels Vra, Vrb and Vrc. A second subread includes three sense operations at the read reference levels Vra plus a first offset, Vrb plus a first offset, and Vrc plus a first offset. A third subread includes three sense operations at the levels Vra plus a second offset, Vrb plus a second offset and Vrc plus a second offset. Finally, the fourth subread will include another three sense operations at the levels Vra plus a third offset, Vrb plus a third offset and Vrc plus a third offset. Alternatively, in a scheme that uses the technique depicted in FIG. 16, applications of different levels of Vread to the neighboring word line while sensing the word line of interest can be used. In such a technique the first subread will include three sense operations at the levels Vra, Vrb and Vrc while word line WL1 receives Vread1. A second subread will also include application of the read reference voltage levels Vra, Vrb and Vrc, but word line WL1 will receive Vread2. The third subread will include three sense operations at the Vra, Vrb and Vrc levels while word line WL1 receives Vread3. Finally, the fourth subread will again include application of the read reference voltage levels Vra, Vrb and Vrc to word line WL0 while word line WL1 receives Vread4. In total it can be seen that in order to read each word line of the physical block a total of 15 sense operations are necessary. This is true for each word line of the block except for the last word line of the block to be read. FIG. 18 sets forth the total number of sense operations in box 610. It can be seen that in order to read a 16 word line physical block utilizing one of the compensation schemes of FIG. 15 or 16, a total number of 228 sense operations is necessary.

If bit line specific compensations are utilized with a single subread at the word line of interest, the number of sense operations can be reduced, but reading will still include additional reads for the neighboring word line when reading a selected word line. Looking at word line WL0 again, reading word line WL1 will still be performed, but reading WL0 will only include 1 subread (3 sense operations). The total number of sense operations when reading all 16 word lines will be 93 as also shown in FIG. 18.

Embodiments in accordance with the present disclosure seek to reduce the number of sense operations for read operations spanning multiple word lines, such as a read operation in response to a request for data from a physical or erase block. FIG. 19 is a similar table as shown in FIG. 18, incorporating a reverse reading technique in accordance with one embodiment. Word lines WL0 through WL15 are listed in column 570. The programming sequence begins with word line WL0 and ends with WL15 as shown in column 572.

Column 574 sets forth the read sequence, beginning with word line WL15 and ending with word line WL0. The manner of selecting and reading the word lines to accomplish read sequence 574 is listed in column 576. For each of the word lines when selected for reading, no other word line must be read to accomplish a compensation technique. The information from an adjacent word line needed to apply or select the results of an appropriate read compensation for the selected word line are already known. By reverse reading, the adjacent word line data can be maintained from the already performed substantive read operation for that word line, thereby avoiding duplicative reads. For example, when word line WL0 is selected for reading during the 16$^{th}$ read operation of the sequence, the data from the WL1 read operation, performed 15$^{th}$, can be utilized. This stands in contrast the technique depicted in column 556 of FIG. 18, where in order to read word line WL0 it is necessary to first read word line WL1, and then repeat reading at word line WL1 at a later time.

The number of sense operations is set forth in column 578. When reading word line WL15, one subread and three sense operations are performed since WL15 has no later programmed neighbor. Word line WL14 is then read. The data read from the memory cells of word line WL15 are already known, and maintained (e.g., data latches 214) when reading word line WL14. Accordingly, four subreads at word line WL14 requiring 12 sense operations, are all that are necessary to accurately read the word line. Contrast this with FIG. 18, where reading word line WL14 first requires reading WL15, and thus, an extra subread and three sense operations. Box 580 sets forth the total number of sense operations when using the technique of FIG. 19. 183 sense operations, compared with 228 using the technique of FIG. 18 are all that are required. By reducing the number of sense operations from 228 to 183, performance improvements when reading the non-volatile memory system are obtained. If bit line specific compensations are utilized with a single subread at the word line of interest, the total number of sense operations would be 48. Each word line will be read in one subread using three sense operations. This too will provide improvements over traditional techniques, reducing the number of sense operations from 93 to 98.

FIG. 19 sets forth a read sequence that can be used for cells programmed by full-sequence programming, upper-lower page programming, and last first mode (LM) programming. The number of sense operations and subreads may vary for upper-lower page reading or LM reading, but will be apparent to those of ordinary skill in the art. While much of the discussion may be presented with respect to full-sequence programmed cells for exemplary purposes, the present disclosure is equally applicable to other processes for cells.

Figure 20:
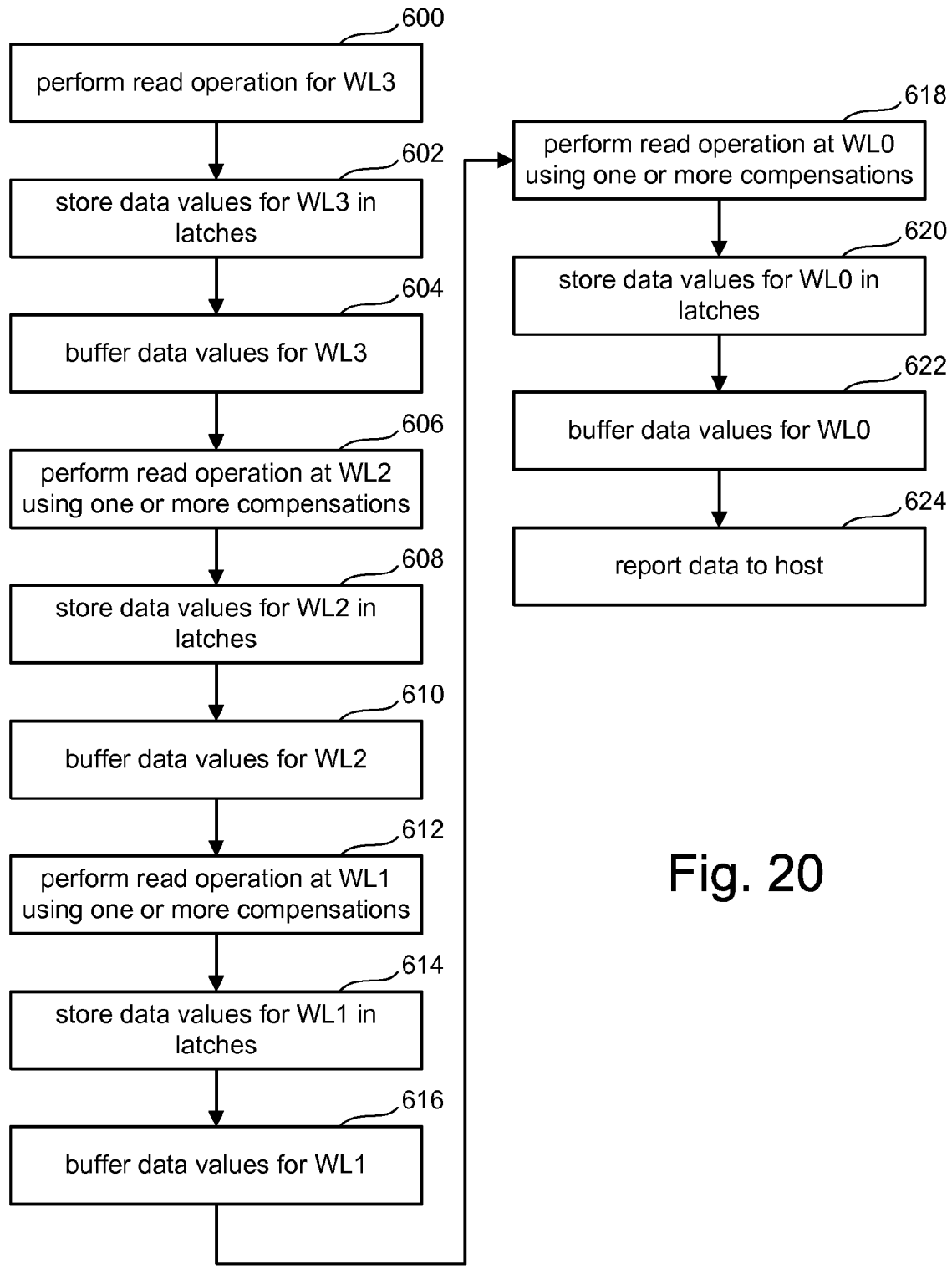
FIG. 20 is a flowchart for reading a set of memory cells using compensation in accordance with one embodiment.

FIG. 20 is a flowchart of a method in accordance with one embodiment for reverse reading a physical block of memory cells. A four word line four state memory system is illustrated for exemplary purposes, the disclosed techniques may be applied to systems with other numbers of word lines and memory starts. The last word line, WL3, to be programmed for the physical block is read at step 600. Because the last word line does not have a later programmed neighboring word line, no compensation is used and the method of FIG. 11 can be applied. The data values determined for WL3 are stored in the latches (e.g., latches 214) for each corresponding bit line. The data values are buffered at step 604, to be reported to the host device later, as will be described hereinafter. A read operation is performed for word line WL2 at step 606 using one or more compensations. Compensation subreads (e.g., FIG. 15 or 16) can be performed in one embodiment and the appropriate read results for each bit line selected, based on the data values determined at step 600 for word line WL3. Alternatively, one or more bit line based compensations can be applied for each bit line and a single subread utilized. At step 608, the data values from the appropriate subread, or from the single subread when using bit line compensation, are stored in the data latches for each bit line. In one embodiment, the data values shared at step 602 are replaced with the WL2 values at step 608. As FIGS. 15 and 16 illustrate, step 608 may be performed in between or as part of the subreads at step 606. In one embodiment that utilizes the technique of FIG. 15, steps 606 and 608 can include performing steps 424-438 of FIG. 15. In one embodiment that utilizes different values of Vread as shown in FIG. 16, steps 606 and 608 can include performing steps 454-468 of FIG. 16. After storing data values for word line WL2 in the latches, the data values are buffered at step 610.

At step 612 a read operation is performed for word line WL1 using compensation subreads or bit line compensation. Because word line WL2 was read at step 606, reading word line WL3 does not require reading word line WL2. The values stored in the latches for each bit line at step 608 can be used to select the appropriate read results or apply the appropriate bit line compensation. At step 614, the data values for word line WL1 are stored in the data latches. The data stored in the latches at step 608 is overwritten in one embodiment. After storing the data values for word line WL1, the data values are buffered at step 616. At step 618 a read operation is performed at word line WL0 utilizing compensation subreads or bit line compensation. The data values for the memory cells at word line WL0 are stored in the appropriate latches at step 620. At step 622, the data values stored at step 620 are buffered. At step 624, the data buffered at steps 604, 610, 616 and 622 is reported to the host or requesting device.

Figure 21:
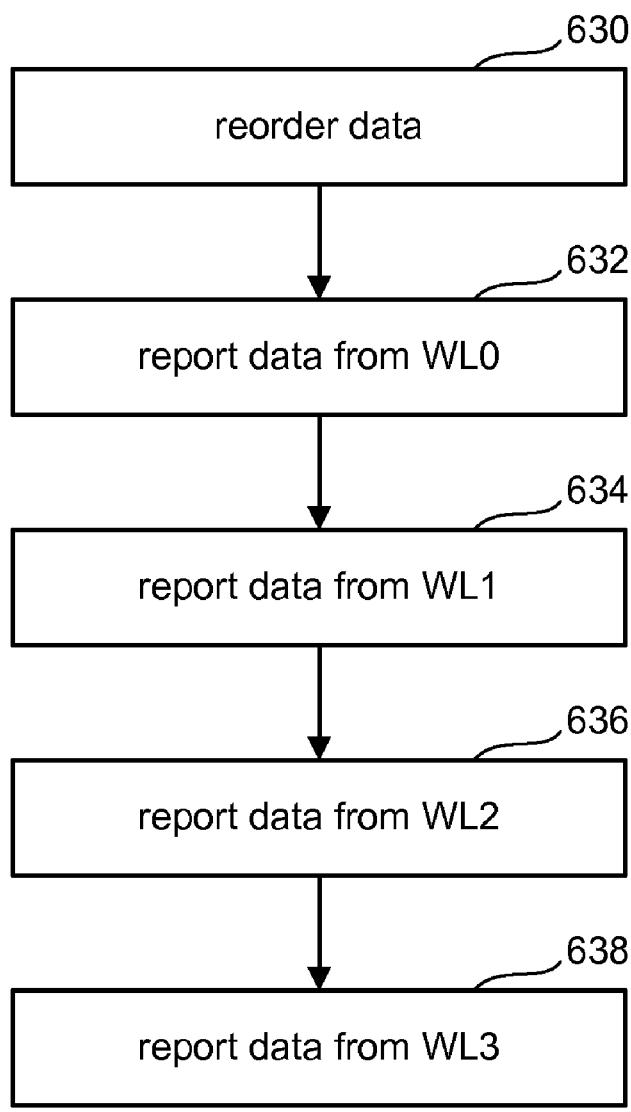
FIG. 21 is flowchart for reporting data to a host in accordance with one embodiment.

FIG. 21 is a flowchart depicting a method for reporting data to the host or requesting device, as can be performed at step 624 of FIG. 20. The data buffered at steps 604, 610, 616, and 622 is reordered at step 630. Reordering the data can include putting the data from word line WL0 first, followed by the data from word line WL1, the data from word line WL2, and finally the data from word line WL3. The data was placed into the buffer in the opposite sequence to which it was programmed in steps 604, 610, 616, and 622. Generally, host devices will expect data in the order it was programmed. Thus, the data is reordered to coincide with the programming sequence. At step 632, the data from word line WL0 is reported to the host device. At step 634, the data from word line WL1 is reported to the host device. At step 636, the data from word line WL2 is reported to the host device, and finally at step 638, the data from word line WL3 is reported to the host device.

Buffering the data values and reporting them to the host can vary by implementation. For example, the data from each word line can be reported to the host after reading each individual word line. After reading word line WL3 and storing the data value in the latches for example, the data could be immediately reported to the host. In such an embodiment, buffering the data values at step 604 may not be necessary. The host device will receive the data in the opposite order of programming and can reorder the data if necessary. The location and type of memory for buffering the data may vary by embodiment. In one embodiment, the data is buffered in a memory such as RAM 131 (FIG. 4) in or accessible by controller 144. The controller can reorder the data and report it to the host. In another embodiment, the data is buffered in a memory such as RAM 133 in or accessible by control circuitry 120. The control circuitry or controller can reorder the data for delivery to the host by the controller.

In some implementations buffering large amounts of data associated with a physical block may not be practical or otherwise desirable. Accordingly, in one embodiment, physical blocks are divided into read blocks to decrease the amount of data required to be buffered at one time, and consequently, the size of memory for buffering. The memory system can reverse read a portion of the physical block (read block), buffer the data, and report that data to the host device. The memory system can read the next read block of the physical block as the data is reported, and buffer the data from the next read block in its place. This process can be performed as many times as necessary until the entire physical block requested by the host device has been read and reported. Various sizes and ways of partitioning the physical block into individual read blocks can be utilized in accordance with different embodiments.

FIG. 22 is a table illustrating the utilization of read blocks in accordance with one embodiment. A 16 word line physical block is illustrated, however physical blocks of other sizes can be divided in a similar manner. The word lines listed from WL15 to WL0 in column 650, are programmed beginning with word line WL0 and proceeding sequentially thereafter to word line WL15, as shown in column 652. The physical block of FIG. 21 has been partitioned into four individual read blocks. Read block 1 includes word lines WL0, WL1, WL2 and WL3. Read block 2 includes word lines WL4, WL5, WL6 and WL7. Read block 3 includes word lines WL8, WL9, WL10 and WL11. Read block 4 includes word lines WL12, WL13, WL14 and WL15. More or fewer read blocks including different numbers of word lines can also be used.

The sequence for reading the physical block is set forth in column 654. When a request for data including the physical block is received, the memory system begins reading and reporting individual read blocks. The read sequence begins with word line WL3 in read block 1. Word line WL3 is the last to be programmed for this read block. The individual operations for reading the selected word line are set forth in column 656. In order to read word line WL3, its neighboring drain side word line WL4 is first read. Actual data values or charge level information can be read from the cells of word line WL4. When reading word line WL4, no compensations are utilized. A single subread and three sense operations (assuming a four state device) are used as shown in column 658. After reading word line WL4, word line WL3 is read. Reading word line WL3 includes four subreads and 12 sense operations when using a word line compensation scheme as shown in FIG. 15 or 16. The data values for each subread will be selected for individual bit lines based on the state of the corresponding adjacent memory cell at word line WL4. An appropriate bit line compensation could alternatively be applied in one embodiment. After reading word line WL3 the read sequence proceeds to word line WL2. Reading word line WL2 only includes four subreads and 12 sense operations. The performance of an additional read operation at word line WL3 is not necessary since the data from word line WL3 is already known. After reading word line WL2, the read sequence proceeds to word line WL1 and word line WL0. After reading read block 1 and buffering the data, the data can be reported to the host device. Reporting the data can include reordering the data to begin with word line WL0 and end with WL3 as shown in FIG. 21.

After the data from read block one has been reported to the host device, read block 2 can be read. In one embodiment, reading read block 2 can begin as the data from read block 1 is being reported. The data from read block 2 can replace the data from read block 1 as it is reported to the host from the buffer memory. Reading read block 2 begins at word line WL7, which includes first reading word line WL8 in order to determine data values or charge level information that can be used when reading word line WL7. Reading the remainder of read block 2 proceeds as described with respect to read block 1, buffering the data from each word line. The data can be reordered and reported to the host, beginning with the data from word line WL4, then word line WL5, then word line WL6, and finally word line WL7.

After reading and reporting the data from read block 2 the memory system will read the data from read block 3 beginning at word line WL11 as illustrated in column in 654. Reading word line WL11 will include first reading word line WL12 to apply compensations when reading WL11 as shown in column 656. After reading word line WL11 and selecting the appropriate values based on the data from word line WL12, the data will be buffered in the memory system. Reading then proceeds to word lines WL10, WL9 and WL8 in a similar fashion to that already described. The memory system will reorder the data beginning with word line WL8 and ending with word line WL11 and report this data to the host device.

After reading read block 3, the memory system proceeds to read read block 4. Reading read block 4 begins at word line WL15 as shown in column 654. Because word line WL15 is the last to be programmed it is not necessary to read any other word lines. After reading word line WL15, word line WL14 is read using the data from WL15 to apply an appropriate compensation. After reading and buffering the data from each of the remaining word lines of read block 4, the data can be reordered and reported to the host beginning with word line WL12 and ending with word line WL15. The read block division of FIG. 22 utilizes a total of 192 sense operations as shown at 660 when a word line compensation scheme is used. If a bit line compensation scheme is used, 57 sense operations are used. As can be seen when looking at FIG. 18, the read block technique of FIG. 22 provides a fewer number of sense operations while keeping the required buffer memory size down.

FIG. 23 is a flowchart depicting a method for reading non-volatile memory in a reverse fashion using individual read blocks. The embodiment of FIG. 23 is set forth utilizing exemplary conditions of four read blocks as was shown in FIG. 22. However, other embodiments may include different numbers of read blocks. At step 700, a read operation is performed for the first word line of the second read block. The first word line refers to the first word line to be programmed for the second read block. Referring to FIG. 22, step 700 would include reading word line WL4. The read operation at step 700 does not include the utilization of any compensation subreads (or bit line compensation) because the read operation is intended to obtain information that can be used when reading the source side neighboring word line. At step 702, the data values (or charge level information) for the first word line of read block two is stored in the data latches. At step 704, a reverse read is performed for the first read block. Reverse reading the first read block will first include reading the last word line of the first read block using compensation based on the first word line of the second read block. Each bit line of the last word line will store the data from the appropriate subread, etc. based on the information determined from reading the first word line of the second read block. After reading the last word line of the first read block, the second to last word line of the first read block will be read and the data values selected based on the previous read of the last word line of the first read block. This will continue until the first word line of the first read block to be programmed has been read. Referring again to FIG. 22, step 704 would include reading word line WL3, then word line WL2, then word line WL1 and finally word line WL0. At step 706, the memory system will buffer the data read from the first read block. In one embodiment, buffering will include buffering the data from each individual word line of the first read block after it has been read at step 704. After buffering the data and reading each word line of the first read block, the memory system will reorder the data to correspond to the order in which the data was programmed to the read block. Referring again to FIG. 22, this will include reordering the data to begin with the data from word line WL0, and ending with the data from word line WL3. After the data has been reordered at step 706, the memory system will report the data of the first read to the host device at step 708.

At step 710, a read operation is performed for the first word line of the third read block. Referring to FIG. 22 again, step 710 would include reading word line WL8 of read block 3. The read operation for the first word line of read block 3 will not include compensation. At step 712, the data values read from the first word line of read block 3 are stored in the latches. At step 714, a reverse read operation for the second read block is performed. This reverse read operation will first include reading the last word line of read block two utilizing compensation based on the information determined from reading the first word line of read block 3 at step 710. Referring again to FIG. 22, performing step 714 can include reading word line WL7 (using data from WL8), followed by word line WL6 (using data from WL9), word line WL5 (using data from WL6), and finally word line WL4 (using data from WL5). At step 716, the data from reverse reading read block two is buffered. Again buffering the data may include buffering the data after reading each individual word line of read block 2. After each word line has been read and the data buffered, the memory system will reorder the data of read block 2, also at step 716. After reordering the data, the data is reported to the host device at step 718. Referring again to FIG. 22, step 718 can include reporting the data from word line WL4, then the data from word line WL5, then the data from word line WL6, and concluding with the data from word line WL7.

At step 720 a read operation for the first word line of the fourth read block is performed. Again, this may include reading word line WL12 as depicted in column 656 for word line WL11 in FIG. 22. The data values for the first word line of the fourth read block are stored in the data latches at step 722. At step 724, a reverse read operation for the third read block is performed as described for read blocks 1 and 2. This will include reading the last word line of the third read block to be programmed first. At step 726 the memory system will buffer and reorder the data into the order in which it was originally programmed. At step 728, the reordered data will be reported to the host device. At step 730 a reverse read of the fourth read block is performed. Because the fourth read block is the last read block, and includes the last word line to be programmed for the physical block, it is not necessary to read any word lines outside of read block 4. Reverse reading read block 4 in the embodiment of FIG. 22 can include reading word line WL15, then word line WL14, then word line WL13, and concluding with word line WL12. The data from the individual word lines will be buffered at step 732. Also at step 732, the memory system will reorder the data to begin with the data from word line WL12 and conclude with the data from word line WL15. This reordered data is then reported to the host device at step 734.

Figure 24:
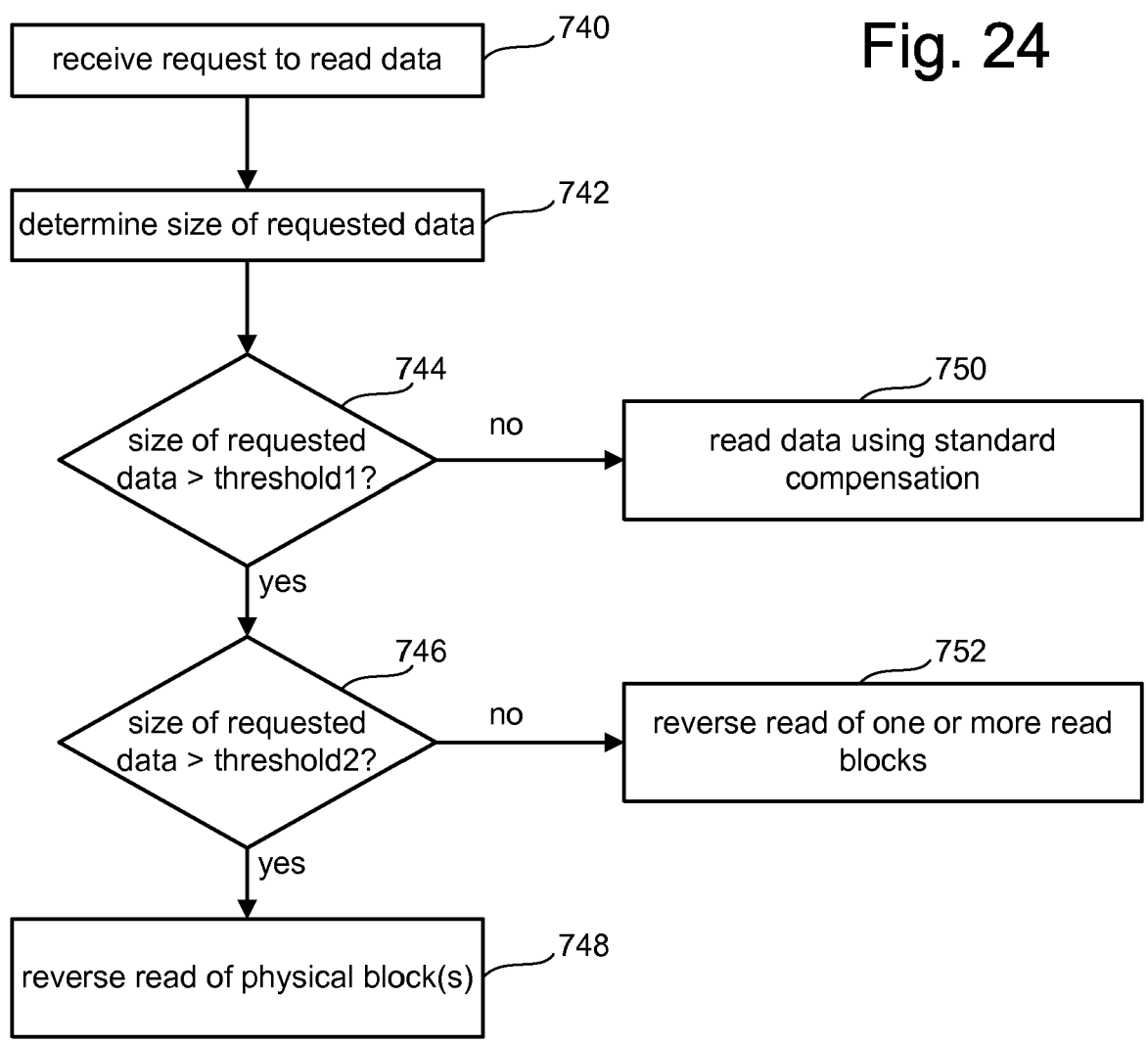
FIG. 24 is a flowchart for reading a set of memory cells using threshold requested data sizes.

In one embodiment, threshold sizes of requested data from host devices are utilized in order to determine whether and to what extent to perform reverse reading operations. FIG. 24 depicts one embodiment utilizing two such thresholds. At step 740, a request to read data is received from the host device. The memory system determines the size of the requested data at step 742. The memory system will compare the size of the requested data to a first threshold at step 744. If the requested size of data is smaller than the first threshold size of data, no reverse read operations are performed. The host device will have requested a small amount of data and in order to efficiently process this small amount of data, the memory system will quickly read the requested data and provide it to the host device. A standard read operation using compensation can be performed at step 750. In one embodiment, the operation performed at step 750 will be performed as depicted in FIG. 15 or FIG. 16. For example, if the size of the requested data corresponds to one word line or less, the memory system can read the appropriate neighboring word line as shown at step 420 of FIG. 15 or step 450 of FIG. 16. After reading the neighboring word line, the selected word line will be read utilizing compensation subreads as depicted in steps 422-438 of FIG. 15 or steps 452-468 of FIG. 15. Bit line compensation can also be used. If the size of the requested data corresponds to more than one word line, individual performances of FIG. 15 and FIG. 16 can be used to read those multiple word lines.

If the size of the requested data is greater than the first threshold, the memory system will compare the size of the requested data with a second threshold at step 746. The second threshold size is larger than the first. If the size of the requested data is larger than the first threshold but smaller than the second threshold, a reverse read operation of one or more read blocks is performed at step 752. For example, a reverse read of the read block containing the requested data, for example read block 1, can be performed at step 752. If the size of the requested data is larger than the second threshold, a reverse read operation for one or more physical blocks can be performed at step 748.

Numerous variations to the technique disclosed in FIG. 24 can be utilized. For example, if the requested data is not larger than the first threshold, a reverse read of at least one read block could be performed in all cases. The host may later request the data and it may be efficient to read and buffer it to avoid reading it later. In such a case, reverse reading one or more read blocks at step 752 may always include reverse reading at least two read blocks. Another embodiment may utilize a single threshold value. In such a case if the requested data is smaller than a first threshold size, the memory system may perform standard read operations as depicted in FIGS. 15 and 16 without reverse reading. In another similar embodiment, if the requested data is smaller than the first threshold size, the memory system may reverse read the physical block beginning with the requested word line and then proceeding in the opposite direction of programming to the end of the physical block. Another option could include moving in the direction of programming by a few word lines before beginning the reverse read. Where one threshold is used, if the size of the requested data is larger than the threshold size, the memory system can reverse read the corresponding physical block(s).

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method of reading non-volatile storage, comprising:
  receiving a request for data stored in a set of non-volatile storage elements coupled to a plurality of word lines, said data is programmed to non-volatile storage elements coupled to a first word line of said plurality prior to non-volatile storage elements coupled to a second word line of said plurality and non-volatile storage elements coupled to a third word line of said plurality, said first word line is adjacent to said third word line;
  in response to said request, reading said set of non-volatile storage elements in a sequence beginning with non-volatile storage elements coupled to said second word line and ending with non-volatile storage elements coupled to said first word line, wherein reading non-volatile storage elements coupled to said first word line includes applying one or more compensations based on charge stored in non-volatile storage elements of said third word line;
  buffering data from non-volatile storage elements of said third word line prior to reading said non-volatile storage elements of said first word line;
  buffering data from non-volatile storage elements of said first word line after buffering data from non-volatile storage elements of said third word line; and maintaining said buffered data from non-volatile storage elements of said third word line after buffering data from non-volatile storage elements of said first word line.

2. The method of claim 1, wherein said non-volatile storage is part of a memory device having an output, said method further comprising:
providing said buffered data read from said non-volatile storage elements of said first word line to said output of said memory device;
providing said buffered data read from non-volatile storage elements of said third word line to said output of said memory device after providing said buffered data read from non-volatile storage elements of said first word line; and
providing buffered data read from non-volatile storage elements of said second word line to said output of said memory device after providing said buffered data read from non-volatile storage elements of said third word line;
wherein said second word line is adjacent to said third word line; and
said data is programmed to non-volatile storage elements coupled to said third word line of said plurality prior to non-volatile storage elements coupled to said second word line.

3. The method of claim 2, further comprising, prior to providing said buffered data from non-volatile storage elements of said first word line, said third word line and said second word line:
reordering said buffered data to coincide with an order of programming said data in said set of non-volatile storage elements.

4. The method of claim 1, wherein applying one or more compensations based on charge stored in non-volatile storage elements of said third word line includes:
performing a plurality of subreads for each non-volatile storage element coupled to said first word line and selecting a result of one of said subreads for each non-volatile storage element based on a state of an adjacent non-volatile storage element of said third word line.

5. The method of claim 1, wherein applying one or more compensations based on charge stored in non-volatile storage elements of said third word line includes:
performing a single subread while applying at least one bit line based compensation for each non-volatile storage element coupled to said first word line, said bit line based compensation is based on a state of an adjacent non-volatile storage element of said third word line.

6. A method of reading in a non-volatile memory system, comprising:
receiving a request for data from a set of non-volatile storage elements in communication with a set of word lines, said set of non-volatile storage elements includes a first subset of non-volatile storage elements in communication with a first subset of said set of word lines and a second subset of non-volatile storage elements in communication with a second subset of said set of word lines, said first subset of non-volatile storage elements is programmed before said second subset of non-volatile storage elements;
reading said first subset of non-volatile storage elements in a direction opposite to that in which said first subset of word lines was programmed, said reading includes:
reading non-volatile storage elements of a first word line to be programmed for said second subset of storage elements, and
reading non-volatile storage elements of a last word line to be programmed for said first subset of non-volatile storage elements using one or more compensations based on reading said non-volatile storage elements of said first word line of said second subset or word lines, and
reading non-volatile storage elements of each remaining word line of said first subset of word lines using one or more compensations based on a previously read word line of said first subset of word lines that is adjacent to said each remaining word line in a direction of said last word line of said first subset of word lines,
buffering data from said first subset of non-volatile storage elements;
providing data read from said first subset of non-volatile storage elements to an output of said memory system;
reading said second subset of non-volatile storage elements after beginning to provide said data from said first subset of non-volatile storage elements, said reading said second subset of non-volatile storage elements is performed in a direction opposite to that in which said second subset of word lines was programmed;
buffering data from said second subset of non-volatile storage elements; and
providing data read from said second subset of non-volatile storage elements to an output of said memory system.

7. The method of claim 6, wherein reading data from said second subset of non-volatile storage elements includes:
reading non-volatile storage elements of a first word line to be programmed for a third subset of non-volatile storage elements of a third subset of said set of word lines, said third subset of non-volatile storage elements is programmed subsequent to said second subset of non-volatile storage elements; and
reading non-volatile storage elements of a last word line to be programmed for said second subset of non-volatile storage elements using one or more compensations based on reading said non-volatile storage elements of said first word line of said third subset of word lines.

8. A method of operating non-volatile storage, comprising:
receiving a request for data stored in a set of non-volatile storage elements coupled to a set of word lines, said data is programmed to said set of non-volatile storage elements beginning with non-volatile storage elements coupled to a first word line of said set of word lines and ending with non-volatile storage elements coupled to a second word line of said set of word lines, said set of word lines including a plurality of word lines between said first word line and said second word line;
in response to said request, reading said set of non-volatile storage elements beginning with non-volatile storage elements coupled to said second word line and ending with non-volatile storage elements coupled to said first word line, said reading includes applying one or more compensations when reading non-volatile storage elements coupled to a selected word line based on reading non-volatile storage elements coupled to a word line adjacent to said selected word line in a direction of said second word line; and
reporting data from said non-volatile storage elements coupled to said set of word lines to a host in a sequence beginning with data from non-volatile storage elements coupled to said first word line and ending with data from non-volatile storage elements coupled to said second word line.

9. The method of claim 8, further comprising:
buffering data read from said set of non-volatile storage elements; and
reordering said data read from said set of non-volatile storage elements prior to said reporting.

10. The method of claim 9, wherein:
buffering data read from said set of non-volatile storage elements includes buffering data beginning with data from non-volatile storage elements coupled to said second word line and ending with data from non-volatile storage elements coupled to said first word line; and
reordering said data comprises reordering said data to coincide with an order of programming said data.

11. The method of claim 10, wherein said plurality of word lines includes a third word line adjacent to said first word line, said buffering data read from said set of non-volatile storage elements includes:
buffering data from non-volatile storage elements coupled to said third word line prior to reading non-volatile storage elements coupled to said first word line;
buffering data from non-volatile storage elements coupled to said first word line after buffering data from non-volatile storage elements coupled to said third word line; and
maintaining said buffered data from non-volatile storage elements coupled to said third word line after buffering data from non-volatile storage elements coupled to said first word line.

12. The method of claim 8, further comprising, prior to receiving said request for data stored in said set of non-volatile storage elements:
receiving said data from said host, said data being received in a first order; and
programming said data in said first order to said set of non-volatile storage elements beginning with non-volatile storage elements coupled to said first word line and ending with non-volatile storage elements coupled to said second word line.

13. The method of claim 8, further comprising:
after reading non-volatile storage elements of each word line and before reading non-volatile storage elements of another word line, storing data values for each non-volatile storage element of said each word line in one or more data latches associated with a bit line of said each non-volatile storage element; and
after storing said data values for each non-volatile storage element of said each word line, buffering said data values in a different memory.

14. The method of claim 13, wherein:
storing data values for each non-volatile storage element of said plurality of word lines includes, overwriting one or more data values from a previously read non-volatile storage element of an adjacent word line in said one or more data latches; and
buffering said data values for each non-volatile storage element of said plurality of word lines includes storing said data values with data values from previously read non-volatile storage elements of an adjacent word line.

15. The method of claim 8, wherein:
said set of word lines includes a third word line adjacent to a first set of select gates for said set of non-volatile storage elements and a fourth word line adjacent to a second set of select gates for said set of non-volatile storage elements.

16. The method of claim 8, wherein:
said first word line is adjacent to a set of source side select gates for said set of non-volatile storage elements; and
said second word line is adjacent to a set of drain side select gates for said set of non-volatile storage elements.

17. A method of operating non-volatile storage, comprising:
receiving data having a first order from a host;
programming said data in said first order to a set of non-volatile storage elements coupled to a set of word lines beginning with non-volatile storage elements coupled to a first word line and ending with non-volatile storage elements coupled to a second word line, said set of word lines including a plurality of word lines between said first word line and said second word line; and
reading said set of non-volatile storage elements beginning with non-volatile storage elements coupled to said second word line and ending with non-volatile storage elements coupled to said first word line, said reading includes applying one or more compensations when reading non-volatile storage elements of a selected word line based on reading non-volatile storage elements of a word line adjacent to said selected word line in a direction of said second word line.

18. The method of claim 17, further comprising:
temporarily storing data read from said set of non-volatile storage elements;
reordering said data read from said set of non-volatile storage elements; and
providing data from said non-volatile storage elements coupled to said set of word lines to said host in a sequence beginning with data from non-volatile storage elements coupled to said first word line and ending with data from non-volatile storage elements coupled to said second word line.

19. The method of claim 18, wherein said plurality of word lines includes a third word line adjacent to said first word line, said temporarily storing data read from said set of non-volatile storage elements includes:
buffering data from non-volatile storage elements coupled to said third word line prior to reading non-volatile storage elements coupled to said first word line;
buffering data from non-volatile storage elements coupled to said first word line after buffering data from non-volatile storage elements coupled to said third word line; and
maintaining said buffered data from non-volatile storage elements coupled to said third word line after buffering data from non-volatile storage elements coupled to said first word line.

20. The method of claim 17, wherein:
said set of word lines includes a third word line adjacent to a set of drain side select gates for said set of non-volatile storage elements and a fourth word line adjacent to a set of source side select gates for said set of non-volatile storage elements.

* * * * *